(12) United States Patent
Minami et al.

(10) Patent No.: US 7,199,472 B2
(45) Date of Patent: *Apr. 3, 2007

(54) SEMICONDUCTOR DEVICE

(75) Inventors: Toshiaki Minami, Ome (JP); Toshiyuki Sakuta, Hamura (JP); Makoto Kuwata, Akiruno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/970,027

(22) Filed: Oct. 22, 2004

(65) Prior Publication Data

US 2005/0051898 A1     Mar. 10, 2005

Related U.S. Application Data

(63) Continuation of application No. 10/411,118, filed on Apr. 11, 2003, now Pat. No. 6,809,419.

(30) Foreign Application Priority Data

Sep. 20, 2002  (JP) .............................. 2002-274885

(51) Int. Cl.
*H01L 23/48* (2006.01)

(52) U.S. Cl. ...................... 257/758; 257/750

(58) Field of Classification Search ................ 257/758, 257/750, 751
See application file for complete search history.

(56) References Cited

U.S. PATENT DOCUMENTS

| 6,150,726 | A | 11/2000 | Feilchenfeld et al. | 257/784 |
| 6,633,082 | B1 | 10/2003 | Oda et al. | 257/750 |
| 6,674,167 | B1 | 1/2004 | Ahn et al. | 257/750 |
| 6,809,419 | B2* | 10/2004 | Minami et al. | 257/758 |

FOREIGN PATENT DOCUMENTS

JP     2000-311964     11/2000

* cited by examiner

*Primary Examiner*—Roy Karl Potter
(74) *Attorney, Agent, or Firm*—Miles & Stockbridge P.C.

(57) ABSTRACT

In a semiconductor device having the upmost wiring layer comprised of aluminum and the wiring layer immediately below it comprised of copper, the upmost wiring layer is made thicker than the wiring layer immediately below it so that the upmost wiring layer is lower in sheet resistance than the wiring layer immediately below it. Multiple ring power lines VR and pads PD are formed of the upmost wiring layer, and the ring power lines VR and the pads PD are connected respectively through power lines VLB1 of the upmost wiring layer. Consequently, the voltage drop on the power feed path from the pads PD to the ring power lines VR can be reduced and the power conduction from the pads PD to the ring power lines VR can be stabilized.

2 Claims, 37 Drawing Sheets

SEMICONDUCTOR DEVICE

CROSS-REFERENCE TO RELATED APPLICATION

This application is a continuation of Application Ser. No. 10/411,118 filed Apr. 11, 2003 now U.S. Pat. No. 6,809,419.

BACKGROUND OF THE INVENTION

The present invention relates to a technique of semiconductor devices, and particularly to a technique which is applicable effectively to the layout of power lines of semiconductor devices.

A semiconductor device including logic circuits, for example, has a fundamental structure of laying internal circuits in the middle of a semiconductor chip (substrate), laying multiple input/output circuit cells to surround the internal circuits, and laying external terminals for the input/output circuit cells. In this structure, multiple power lines having a shape of planar rings (will be termed "ring power lines" hereinafter) running around the outer edge of the internal circuits are laid between the internal circuits and the external terminals thereby to conduct power voltages to the internal circuits and input/output circuit cells. Power conduction to the ring power lines is from the external terminals for power supply.

The inventors of the present invention have studied a technique, in which the external terminals and ring power lines are formed of a same wiring layer. For the connection of an external terminal for power supply to a ring power line which is located inner than the outmost ring power line, the external power supply terminal cannot be connected directly (as a unitary stuff) to the inner ring power line due to the layout of at least the outmost ring power line between the terminal and the inner line, and therefore the external terminal for power supply needs to be connected to the inner ring power line through another wiring layer via thru-holes.

A power line layout technique is disclosed in Japanese Unexamined Patent Publication No. 2000-311964 for example, in which power pads 12 are formed of a wiring layer separately from the wiring layer of power lines, i.e., equivalent to the ring power lines mentioned above, and these members are connected electrically through electrical contacts.

SUMMARY OF THE INVENTION

The inventors of the present invention have found at the first time the following problem in the technique of connecting the external terminals for power supply to the ring power lines by way of other wiring layer via thru-holes.

Namely, the external terminals for power supply are connected to the ring power lines through lines of other wiring layer (bypass lines) having a different sheet resistance, and a resulting increased voltage drop on the power feed path from the external terminals for power supply to the ring power lines can cause the instability of power supply to the input/output circuit cells and internal circuits. This problem becomes pronounced with the enhancement of function of semiconductor devices and the lowering of their power voltage. One reason is that the load current increases with the enhancement of function of semiconductor device, which results in an increased variation of load current and voltage drop in the semiconductor device. Another reason is that the allowable power voltage fluctuation is narrowed in the trend of lower power voltages of semiconductor devices for the sake of lower power consumption and higher durability of elements.

The study conducted by the inventors of the present invention has revealed at the first time that the above-mentioned problem is particularly pronounced for semiconductor devices having different line structures, specifically, having wiring lines comprised of copper (Cu) as main element and wiring lines comprised of aluminum (Al) as main element.

Precise low-resistance line structures using copper as main element and based on the damascene wiring technique are adopted increasingly in recent years. However, the technique of connection between bonding wires and external terminals of copper is still in the development stage, whereas the connection between bonding wires and external terminals of aluminum is already a common technique and it is inexpensive relative to the use of copper. On this account, even in the copper line structure, an aluminum wiring layer is used for the upmost layer for the sake of connection to the external terminals in many cases. In this case, the difference of sheet resistance between the upmost aluminum wiring layer and the copper wiring layer immediately below it creates a significantly increased voltage drop on the bypass lines from the external terminals for power supply to the ring power lines, causing the instability of power supply.

A conceivable scheme is to increase the width of bypass lines so that their relatively high resistivity is lowered. However, simply widening the wiring lines imposes another problem of a decreased area for the layout of input/output circuit cells.

It is an object of the present invention to provide a technique capable of enhancing the stability of power supply within semiconductor devices.

These and other objects and novel features of the present invention will become apparent from the following description and accompanying drawings.

Among the affairs of the present invention disclosed in this specification, representatives are briefed as follows.

The present invention resides in a layout structure of power lines in a semiconductor device, in which multiple external terminals are connected directly on a same wiring layer to multiple first power lines which are laid to run around the outer edge of a first circuit area.

The present invention resides in a layout structure of power lines in a semiconductor device, in which wiring lines of the upmost wiring layer which are comprised of aluminum as main element are lower in sheet resistance than wiring lines of the wiring layer immediately below the upmost wiring layer which are comprised of copper as main element.

DESCRIPTION OF THE PREFERRED EMBODIMENTS

Figure 1:
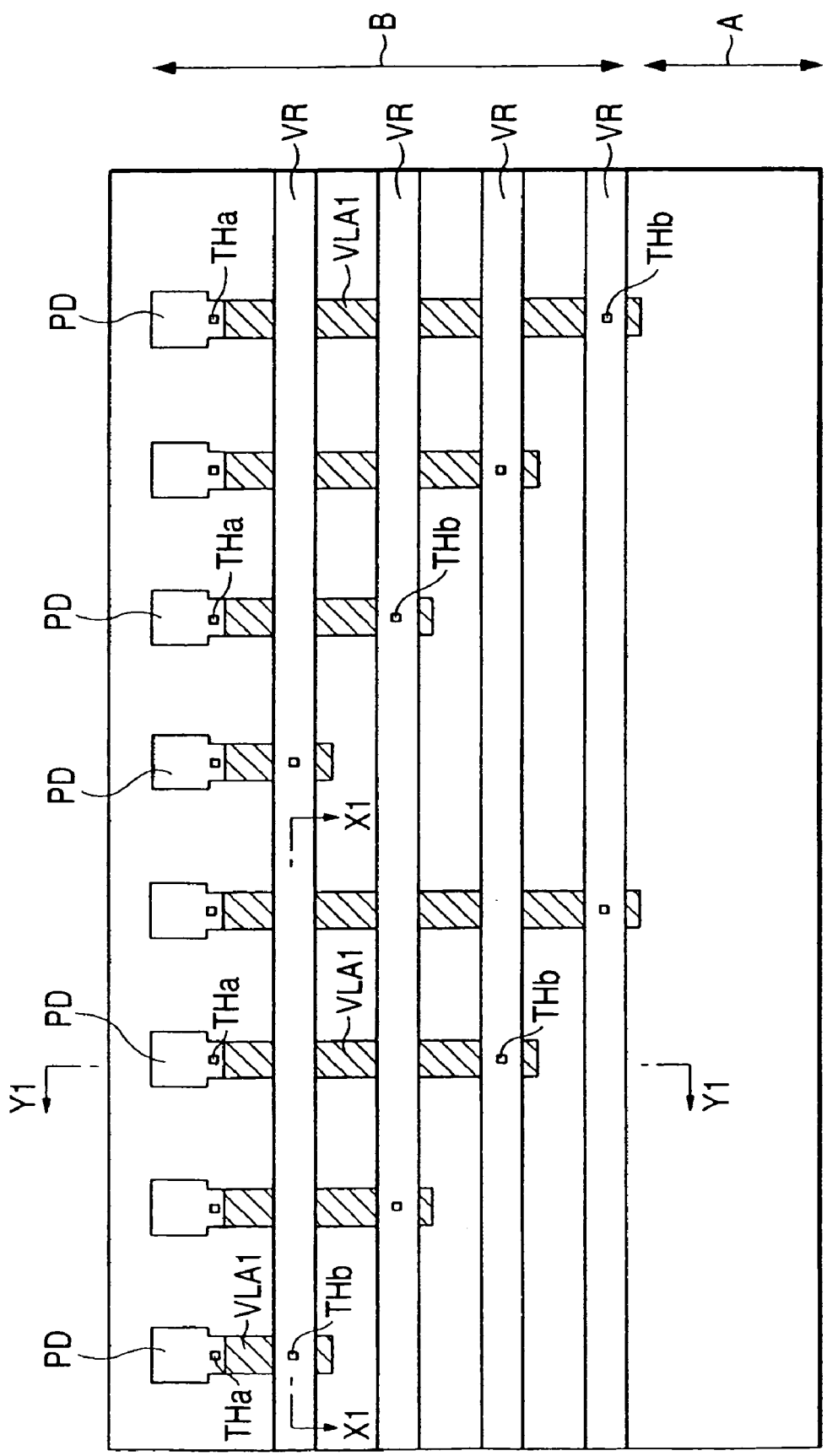
FIG. 1 is a plan view of the principal portion of a semiconductor chip (substrate), showing the connection between the external terminals and the power lines based on an embodiment of this invention.

Before entering into the details of embodiments, the meaning of the terms used in the explanation will be briefed.
1. The sheet resistance of wiring line signifies the value of resistance of a wiring line per unit square, i.e., the value of resistance of a wiring line having a unit line width and a unit line length. For a wiring line with sheet resistance Rs, line length L, line width W and line thickness d, the resistance value R is expressed by: $R=Rs(L/W)$ or $R=\rho(L/W)$ [$\Omega$]. $\rho$ is the resistivity having the unit [$\Omega \cdot cm$]. The resistance value R is also expressed by $R=Rs(L/W)$ or $R=\rho/d(L/W)$. The value of sheet resistance is dependent on the thickness, and it has the unit [$\Omega$/square].
2. In the following explanation of embodiments, phrasings of "comprised of copper", "copper as main element, or "copper as main element of wiring lines" are all intended to signify the use of copper as main component. Practically, even high-purity copper includes impurities, and the inclusion of additives or impurities in a material of copper is not precluded. Moreover, these phrasings comprehend the lamination of metallic films of other materials on the surface of a material of copper. The main element can be other metal, e.g., aluminum or titanium nitride, besides copper.
3. Terms "silicon nitride" and "silicon nitride film" not only signify $Si_3N_4$, but they comprehend insulation films composed of any nitride of silicon.
4. Terms "buried line" or "buried metallic line" signify a wiring line which is formed by burying a conductor film in an opening for wiring such as a groove or hole formed in an insulation film based on the single damascene scheme or dual damascene scheme, and removing residual conductor on the insulation film based on the line patterning process. The single damascene is a buried wiring process in which a plug metal and a wiring metal are buried in two processing steps. The dual damascene is a buried wiring process in which a plug metal and wiring metal are buried at once. Generally, buried wiring lines of copper in a multi-layer structure are mostly adopted.
5. Term "conductive barrier film" signifies a relatively thin conductive film having the property of diffused barrier formed on the sides or bottom of a buried line in order to prevent copper from diffusing into the inter-layer insulation film or lower layer, and it is generally made from high fusing point metal or its nitride such as titanium nitride (TiN), tantalum (Ta) or tantalum nitride (TaN).
6. Term "low-permittivity insulation film" (low-K insulation film) is, for example, an insulation film which is lower in permittivity than a silicon oxide film, e.g., TEOS (Tetra-ethoxysilane) oxide film. Generally, a TEOS oxide film having a relative dielectric constant $\epsilon$ of 4.1–4.2 or smaller is said to be a low-permittivity insulation film.

In the following explanation of embodiments, a complete semiconductor device will be explained by division into several portions or several embodiments for the expedience of explanation. However, these divisions are intended to show variants resulting from partial or entire modifications or present detailed or supplementary explanations, unless otherwise noted clearly. In the following explanation of embodiments, the numbers, values, quantities and ranges of values are merely examples, unless otherwise noted clearly or unless the quantitative confinement is self evident. In the following explanation of embodiments, the constituents and processing steps are not of absolute necessity, unless otherwise noted clearly or unless they are self evident. In the following explanation of embodiments, the shapes and positional relationships of constituents and the numbers, values, quantities and ranges of values are comprehensive in a sense of approximation or resemblance, unless otherwise noted clearly or unless they are self evident. In the following explanation of embodiments, items which are identical in function are referred to by same symbols throughout the drawings, and explanation will not be repeated. On drawings, items are occasionally shown by use of hatching or shading even in plan views for the sake of clarity. Embodiments based on this invention will now be explained with reference to the drawings. In the following embodiments, a MIS-FET (Metal Insulator Semiconductor Field Effect Transistor) which represents a field effect transistor will be termed simply "MIS", and a p-channel MIS-FET and n-channel MIS-FET will be termed simply "pMIS" and "nMIS", respectively.

Embodiment 1

Figure 2:
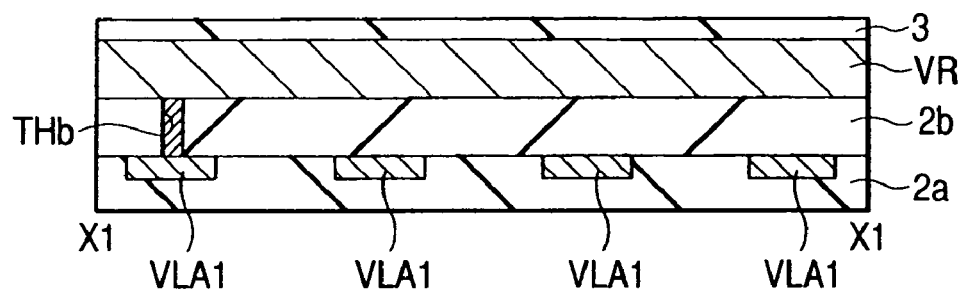
FIG. 2 is a cross-sectional view of the principal portion of the wiring layers taken along the line X1—X1 of FIG. 1.
Figure 3:
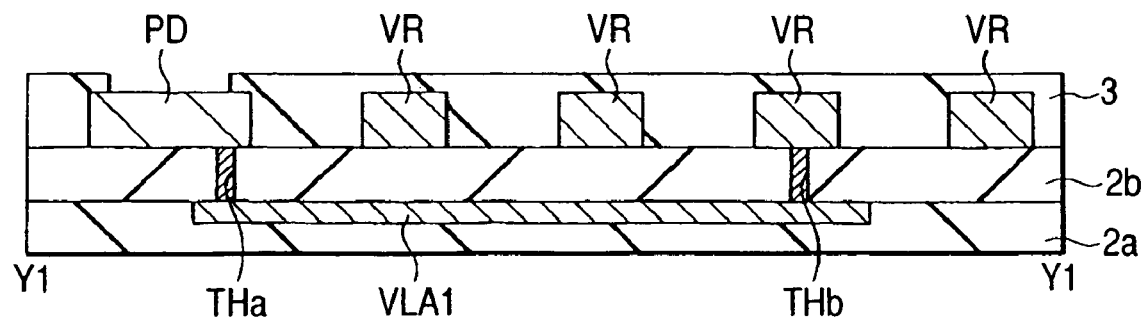
FIG. 3 is a cross-sectional view of the principal portion of the wiring layers taken along the line Y1—Y1 of FIG. 1.

The first embodiment is a semiconductor device having a line structure of copper (Cu). The copper line structure has wiring layers of copper as main element of line material (will be termed "copper wiring layers" hereinafter) in the structure of multi-layer line structure. Even the copper line structure has a wiring layer of aluminum (Al) as main element (will be termed "aluminum wiring layer" hereinafter) for the upmost wiring layer. The reason is that the technique of connection between bonding wires (will be called simply "wires") and bonding pads (will be termed "external terminals" or "pads" hereinafter) of copper is still at the development stage, whereas the connection between wires and pads of aluminum is already a common technique and it is inexpensive relative to the use of copper, as described previously. In this embodiment, the upmost aluminum wiring layer is made thicker than the copper wiring layer immediately below it with the intention of reducing the resistance, and it has a sheet resistance as low as about ⅓ of other copper wiring layers. The upmost aluminum wiring layer is too thick for the patterning process to make narrow signal lines, and it is preferably used mainly for power lines. This vertical structure having an aluminum wiring layer for the upmost wiring layer, which is followed by other wiring layers of copper, with the aluminum wiring layer being made incomparably thicker than the copper wiring layers so that it is highly useful for the power lines, can be a dominant solution for the fabrication process at the present stage. The inventors of the present invention have studied from various viewpoints the manner of use of the upmost aluminum wiring layer which is low in resistance and thus useful for the power lines. FIG. 1 is a plan view of a semiconductor chip (substrate) 1C, showing the connection between pads PD and ring power lines (second lines and first power lines) VR, and FIG. 2 and FIG. 3 are cross-sectional views of the wiring layers taken along the line X1—X1 and Y1—Y1, respectively, of FIG. 1. Indicated by A in FIG. 1 is an internal circuit area (first circuit area), and indicated by B is a peripheral circuit area (second circuit area). Indicated by 2a and 2b in FIG. 2 and FIG. 3 are inter-layer insulation films, and indicated by 3 is a surface protection film. The pads PD and ring power lines VR are comprised of aluminum as main element, for example, and formed of the upmost wiring layer. The layer below the layer of the pads PD and ring power lines VR has a formation, by being interposed by an insulation film 2b, of power lines (first lines) VLA1 which extend crisscross (at right angles) against the ring power lines VR. The power lines VLA1 are comprised of copper as main element for example, and formed based on the single damascene scheme or dual damascene scheme (will be called generically "damascene scheme"). The pads PD and ring power lines VR are made incomparably thicker than the power lines VLA1 of the lower layer so that their sheet resistance is lower than that of VLA1. According to this power line connection scheme, a pad PD of a power voltage is connected to a power line VLA1 of the lower layer via a conductor filled in one thru-hole THa, and the VLA1 is further connected to an intended ring power line VR of the upmost layer via a conductor filled in another thru-hole THb. In this case, however, due to the difference in sheet resistance between the upmost aluminum-based pad PD and ring power line VR and the copper-based power line VLA1 immediately below them, the voltage drop on the bypass line (including thru-holes THa and THb and power line VLA1) between the pad PD and the ring power line VR increases considerably, causing the instability of power supply to the internal circuits, as found at the first time by the inventors of the present invention.

Figure 4:
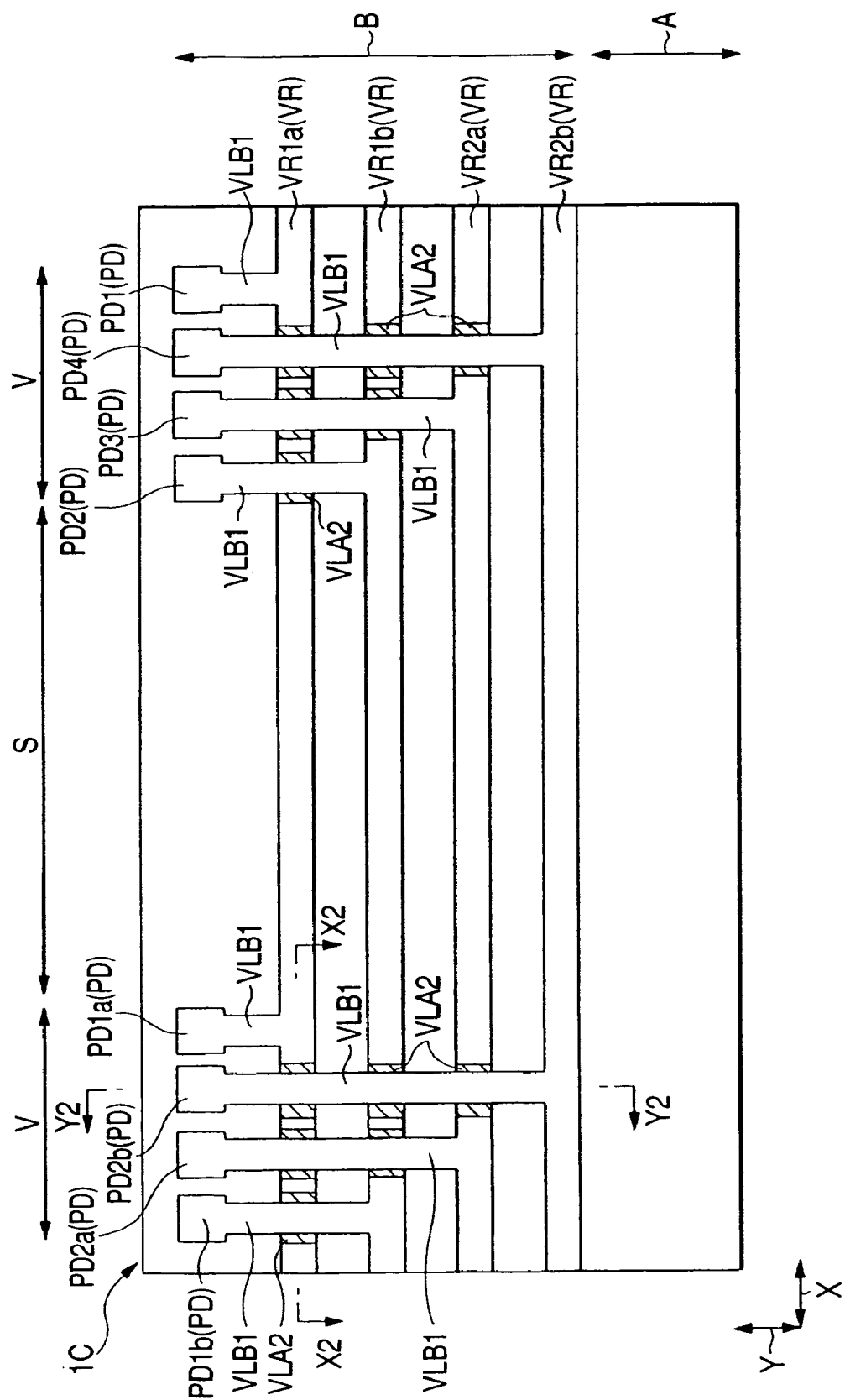
FIG. 4 is a plan view of the principal portion of a semiconductor chip (substrate), showing the connection between the external terminals and the ring power lines based on an embodiment of this invention.
Figure 5:
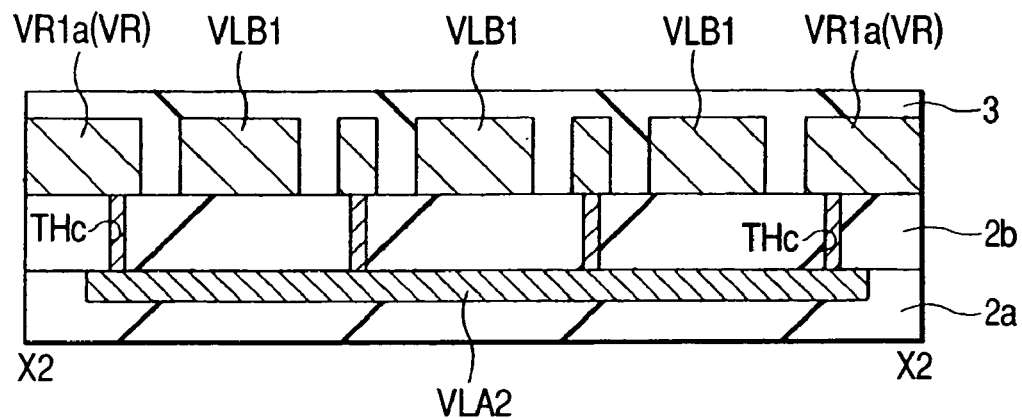
FIG. 5 is a cross-sectional view of the principal portion of the wiring layers taken along the line X2—X2 of FIG. 4.
Figure 6:
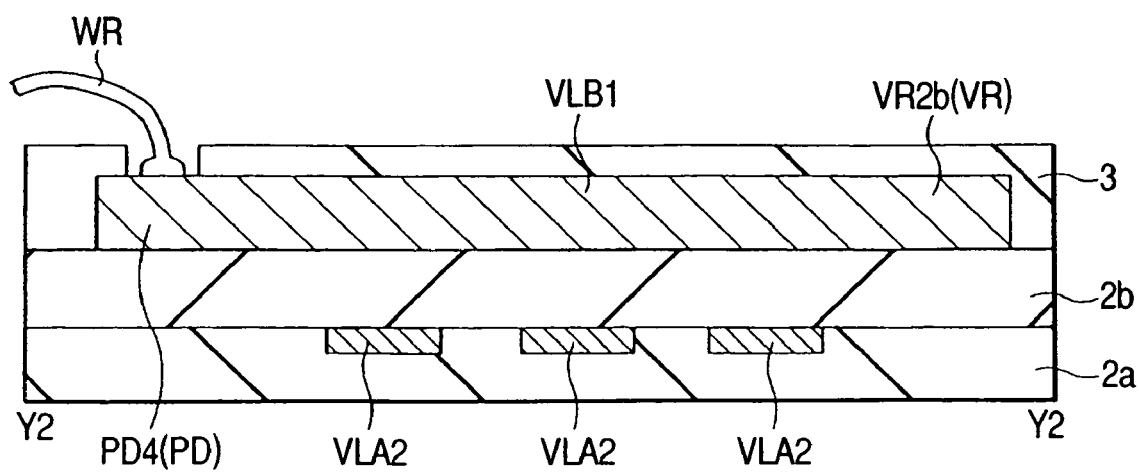
FIG. 6 is a cross-sectional view of the principal portion of the wiring layers taken along the line Y2—Y2 of FIG. 4.

For coping with this matter in this embodiment, the upmost low-resistance aluminum wiring layer is used exclusively for the pads and power lines (only ring power lines, or power lines including the ring power lines and other power lines), and furthermore the pads and power lines are formed as a unitary stuff so as to be in a state of direct connection. Consequently, the voltage drop on the path from the power supply pads to the power lines can be reduced, and thus the stability of power conduction from the pads to the power lines and to the internal circuits can be enhanced, and thus the performance of semiconductor device can further be upgraded. The elimination of the need of widening the bypass lines having a relatively large resistance relaxes the line layout space in the peripheral circuit area, facilitating the signal line layout design and enabling the increased layout density. The thicker pads PD can increase the bonding strength and alleviate or prevent the emergence of cracks under the pads PD, and consequently the yield of production and the reliability of the semiconductor device can be improved. FIG. 4 is a plan view of a semiconductor chip (substrate), showing the connection between pads PD (PD1$a$, PD1$b$, PD2$a$ and PD2$b$) and ring power lines VR (VR1$a$, VR1$b$, VR2$a$ and VR2$b$) of this embodiment, and FIG. 5 and FIG. 6 are cross-sectional views of the wiring layers taken along the line X2—X2 and line Y2—Y2 of FIG. 4 and FIG. 5, respectively. Indicated by V in FIG. 4 are power conduction areas, and S is a signal line layout area. In the peripheral circuit area B of the upmost wiring layer, the pads PD, ring power lines VR and power lines (second lines and second power lines) VLB1 are laid. The pads PD, ring power lines VR and power lines VLB1 are comprised of aluminum as main element for example. A pad PD of virtually a square shape is located near the outer edge of the semiconductor chip (substrate) 1C. The surface protection film 3 has a formation of opening so that the pad PD is partly exposed, and a wire WR is bonded to the pad PD through the opening. The wire WR is comprised of gold (Au) or aluminum (Al) for example. The planar ring power lines VR are laid to run around the outer edge of the internal circuits A. Power voltages are conducted to the peripheral circuits and internal circuits through the ring power lines VR. The figures show for example the arrangement of conducting different power voltages to the integrated circuit within a semiconductor chip (substrate) 1C. The pads PD1$a$ and PD1$b$ and the ring power lines VR1$a$ and VR1$b$ are the wiring for feeding a power voltage of around 3.3 V. Specifically, the pad PD1$a$ and ring power line VR1$a$ are for feeding a high voltage VDD1 (e.g., 3.3 V), and the pad PD1$b$ and ring power line VR1$b$ are for feeding a reference voltage VSS1 (e.g., ground voltage of 0 V). The pads PD2$a$ and PD2$b$ and the ring power lines VR2$a$ and VR2$b$ are the wiring for feeding another power voltage, e.g., around 1.2 V, lower than the voltage of the pads PD1$a$ and PD1$b$ and the ring power lines VR1$a$ and VR1$b$. Specifically, the pad PD2$a$ and ring power line VR2$a$ are for feeding a high voltage VDD2 (e.g., 1.2 V), and the pad PD2$b$ and ring power line VR2$b$ are for feeding a reference voltage VSS2 (e.g., ground voltage of 0 V). The layer below the layer of the pads PD, ring power lines VR and power lines VLB1 has a formation, by being interposed by the insulation film 2$b$, of power lines (first lines) VLA2 which extend along the ring power lines VR. The power lines VLA2 are comprised of copper as main element for example, and formed based on the damascene scheme for example. The pads PD, ring power lines VR and power lines VLB1 are made incomparably thicker than the power lines VLA2 of the lower layer so that their sheet resistance is lower than that of VLA2. According to the power line connection scheme of this embodiment, the pads PD, ring power lines VR and power lines VLB1 to be connected together electrically are formed as a unitary stuff. Namely, the pads PD are connected directly to the intended ring power lines VR through the power lines VLB1 instead of going round through the low-order copper wiring layer which is relatively high in sheet resistance. Consequently, the voltage drop on the path from the power supply pads PD to the ring power lines VR can be reduced more significantly than the case shown in FIG. 1. This voltage drop reduction is effectuated on both power lines of the high voltages (VDD1 and VDD2) and reference voltages (VSS1 and VSS2). Among semiconductor devices using a power voltage of 1.2 V for the internal circuits, some devices have an allowable voltage drop of around 60 mV on the path to the internal circuits, and this value of voltage drop is reached only by the wiring around the pads in the case of the connection scheme of FIG. 1. Whereas, according to this embodiment of invention, the voltage drop in question can be alleviated to as small as around 30 mV, i.e., half the case of FIG. 1. Consequently, according to this embodiment, the stability of power conduction from the power supply pads PD of both the high voltages and reference voltages to the peripheral circuits and internal circuits can be enhanced, and thus the performance of semiconductor device can further be upgraded. The elimination of the need of widening the lower-layer copper lines having a larger resistance than pads PD relaxes the line layout space in the peripheral circuit area, facilitating the signal line layout design and enabling an increased layout density. In this structure, the power lines VLB1 which connect the pads PD to the ring power lines VR are laid crisscross (at right angles) against the ring power lines VR (X direction in FIG. 4), causing the ring power lines VR to be cut off physically in the layout areas of the power lines VLB1. Both parts of the physically divided power lines VLB1 are connected to the lower-layer power lines VLA2 via conductors filled in the thru-holes THc shown in FIG. 5, and thus these parts are connected together electrically. The ring power lines VR and the power lines VLA2 which supplement their connection are in exclusive positional relation, and the line layout is designed so that the ring power lines VR and the power lines VLA2 do not coexist except for the areas. of thru-holes THc.

Figure 7:
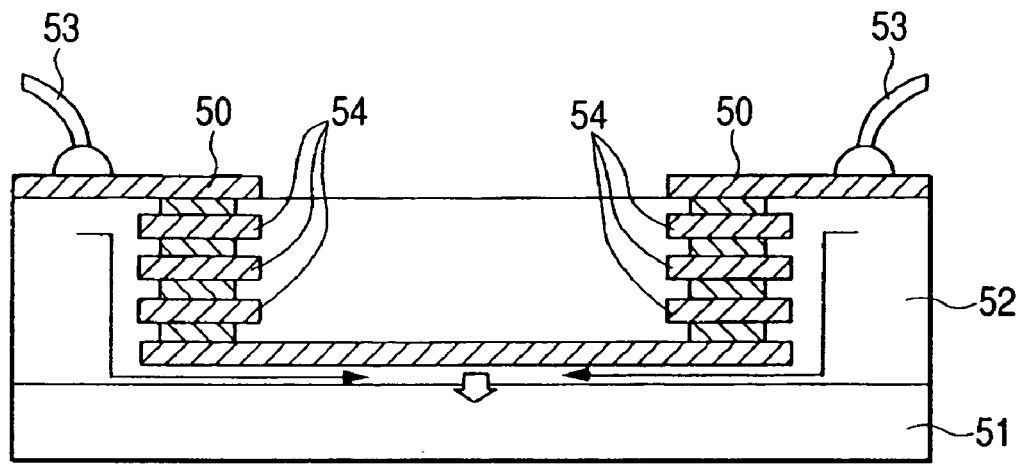
FIG. 7 is an explanatory diagram showing for comparison with the present invention the power conduction scheme within a semiconductor device studied by the inventors of the present invention.

FIG. 7 is an explanatory diagram showing for comparison with the present invention the power conduction scheme within a semiconductor device studied by the inventors of the present invention. The figure shows pads 50, a semiconductor substrate 51, an inter-layer insulation film 52, wires 53, and power lines 54 of copper as main element. A power voltage supplied through the wires 53 to the pads 50 located at the outer edge of the semiconductor chip (substrate) is conducted as shown by the arrows to the peripheral circuit area and internal circuit area located at the edge and middle of the semiconductor chip (substrate) by way of the power lines 54 of lower layers having a relatively large resistance. There arises a considerably large voltage drop on the path from the pads 50 to the peripheral circuits and internal circuits. In order to prevent a large voltage drop, the power lines 54 must made wider, which tightens the wiring space of the peripheral circuit area, obstructs the signal line layout, and decreases the layout density. The proportion of signal line layout area allowed on the first wiring layer is around 22% for example.

Figure 8:
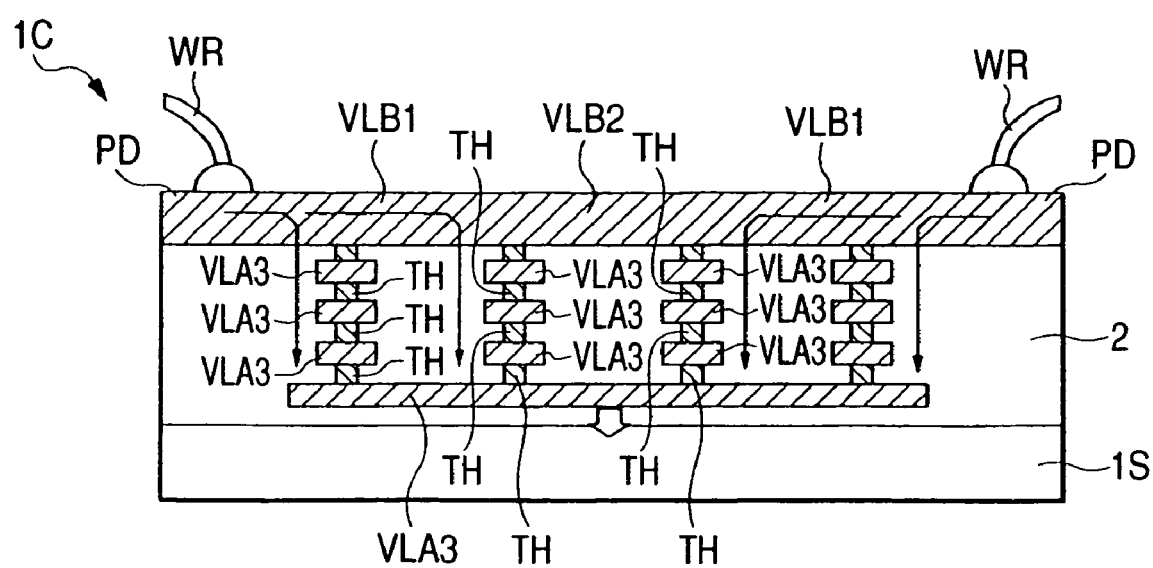
FIG. 8 is an explanatory diagram of the power conduction scheme within a semiconductor device based on an embodiment of this invention.

In contrast, FIG. 8 is an explanatory diagram of the power conduction scheme within a semiconductor device based on an embodiment of this invention. The figure shows a semiconductor substrate (will be termed simply "substrate") 1S and an inter-layer insulation film 2, with power feed paths being shown by the arrows. Formed on the upmost wiring layer are pads PD and power lines VLB1, and in addition there are formed as unitary stuff common to these pads and lines another power lines (second power line, third power line and fourth power line) VLB2 which are laid over the internal circuit area in the middle of the semiconductor chip (substrate) 1C. The power voltage supplied through wires WR to the pads 50 at the outer edge of the semiconductor chip (substrate) is conducted directly through the power lines VLB1 and VLB2 of the upmost wiring layer having a relatively low resistance up to the positions immediately above the peripheral circuit area and internal circuit area located at the edge and middle of the semiconductor chip (substrate) 1C. From these positions, the power voltage is conducted to the peripheral circuits and internal circuits by way of power lines VLA3 of lower layers of copper as main element having a relatively large resistance and conductors filled in thru-holes TH. Consequently, the voltage drop on the path from the power supply pads 50 for both the high voltage and low voltage to the peripheral circuits and internal circuits can be reduced significantly, and thus the stability of power conduction from the pads PD to the peripheral circuits and internal circuits can be enhanced, and thus the stability of circuit operation of the semiconductor device can be enhanced, and thus the performance of semiconductor device can further be upgraded. The elimination of the need of widening the lower-layer copper lines having a relatively large resistance relaxes the line layout space in the peripheral circuit area and internal circuit area, facilitating the signal line layout design and enabling an increased layout density. The proportion of signal line layout area allowed on the first wiring layer can be increased to about 44% for example, which is double the case of FIG. 7.

Figure 9:
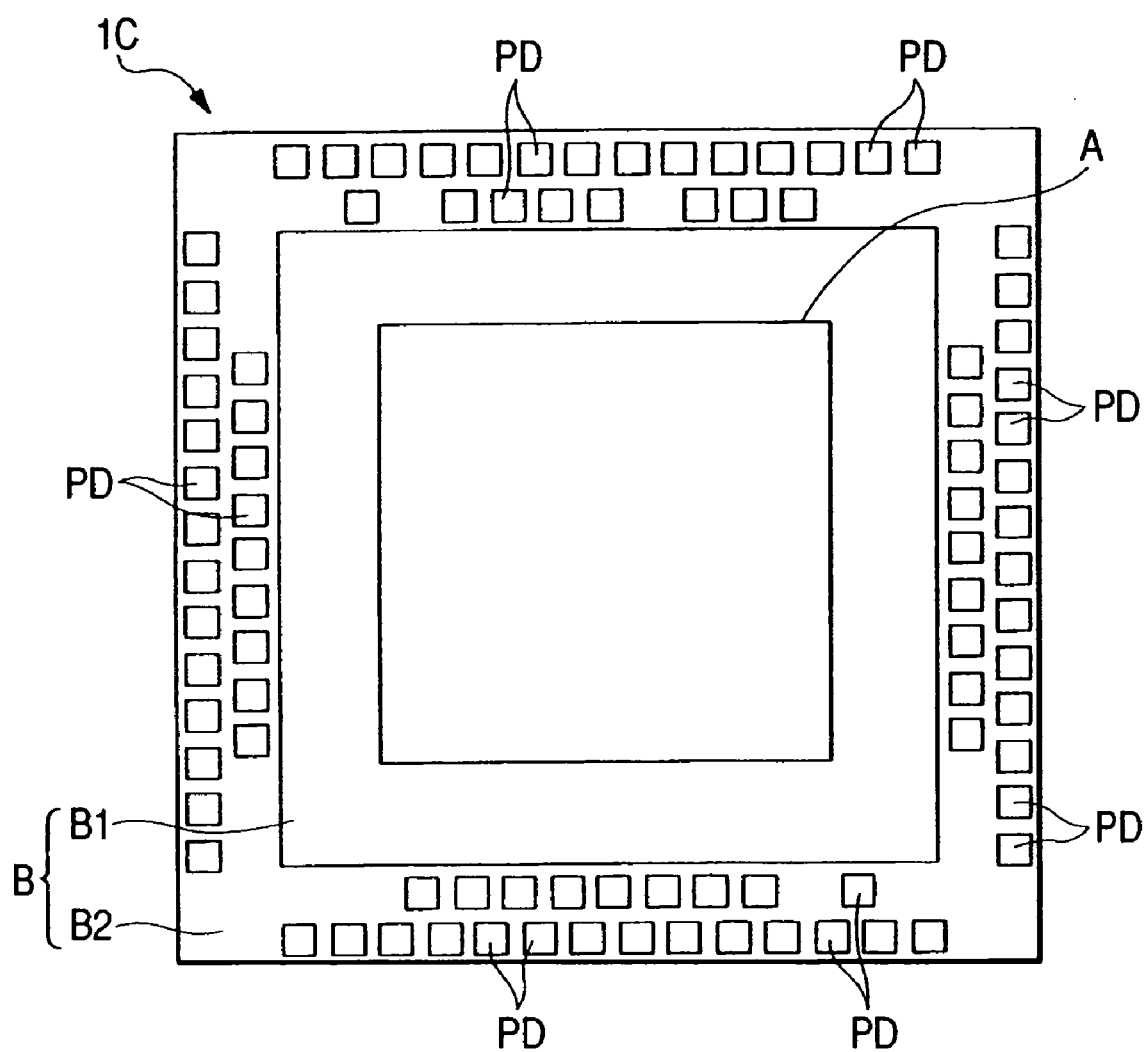
FIG. 9 is an overall plan view of a semiconductor chip which constitutes the semiconductor device (substrate) based on an embodiment of this invention.

Next, a specific arrangement of this embodiment will be explained. FIG. 9 is an overall plan view of the semiconductor chip (substrate) 1C of this embodiment. In the middle of the semiconductor chip (substrate) 1C having a flat square shape, there is a square area A for the internal circuits. Formed in the internal circuit area A are several processors including a DSP (Digital Signal Processor), which operate in unison to perform concurrent processings. Based on the parallel processes for commands and data to realize the enhanced process performance, it is possible to process video data or the like quickly on a real-time basis. The space between the outer edge of internal circuit area A and the outer edge of the semiconductor chip (substrate) 1C is assigned to the peripheral circuit area B mentioned previously. The peripheral circuit area B includes an input/output circuit area B1 near the outer edge of internal circuit area A and a pad area B2 which is next outwardly to the area B1. The input/output circuit area B1 has a layout of input/output circuit cells aligning along the outer edge of the semiconductor chip (substrate) 1C. The input/output circuit cells have a formation of various interface circuits including input circuits, output circuits, bidirectional input/output circuits, and electrostatic protection circuits, for example. The pad area B2 has a layout of pads PD aligning along the outer edge of the semiconductor chip (substrate) 1C. The pads PD include signal pads for individual input/output circuit cells and power supply pads. The pads PD are aligned at alternate positions on two rows in this example, so that a larger number of pads per area can be laid out, so that a semiconductor device with a larger number of pins can be made compact.

Figure 10:
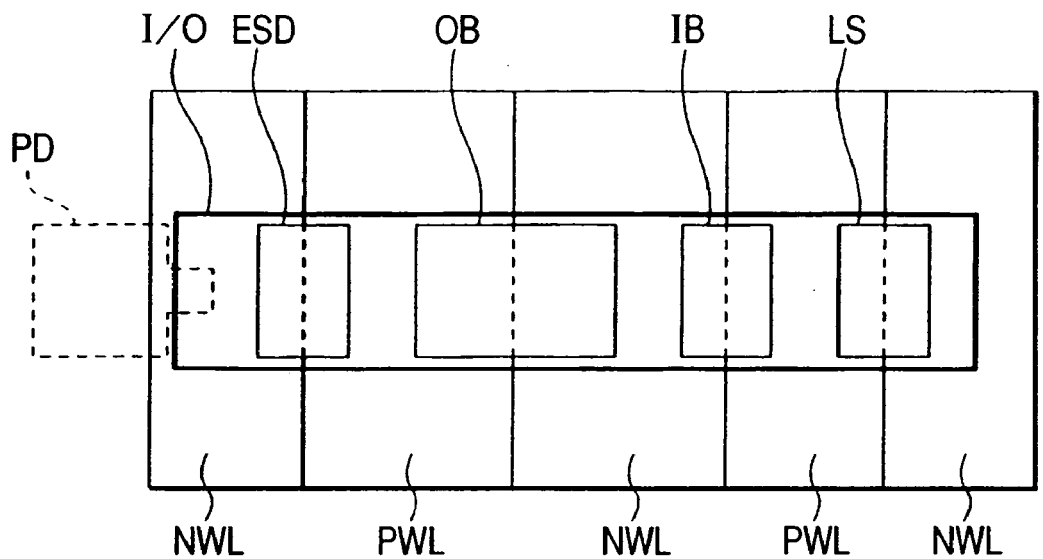
FIG. 10 is a plan view showing schematically the principal portion of an input/output circuit cell of the semiconductor chip (substrate) shown in FIG. 9.
Figure 11:
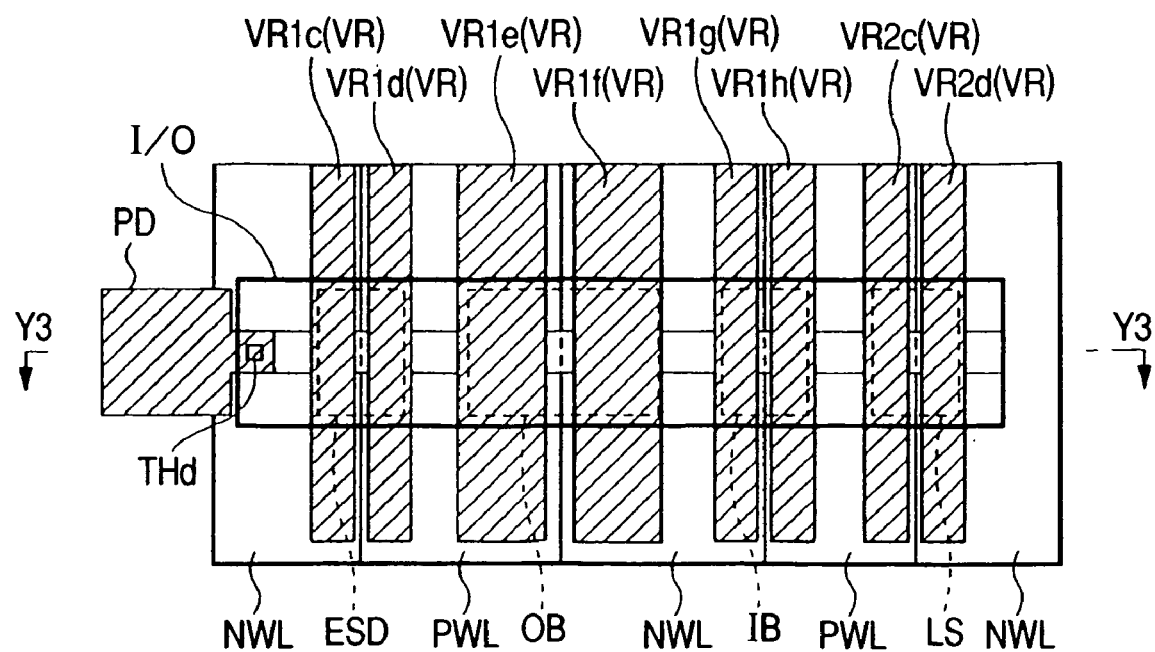
FIG. 11 is a plan view of the principal portion of the semiconductor chip (substrate) shown in FIG. 10, with the power lines being added.
Figure 12:
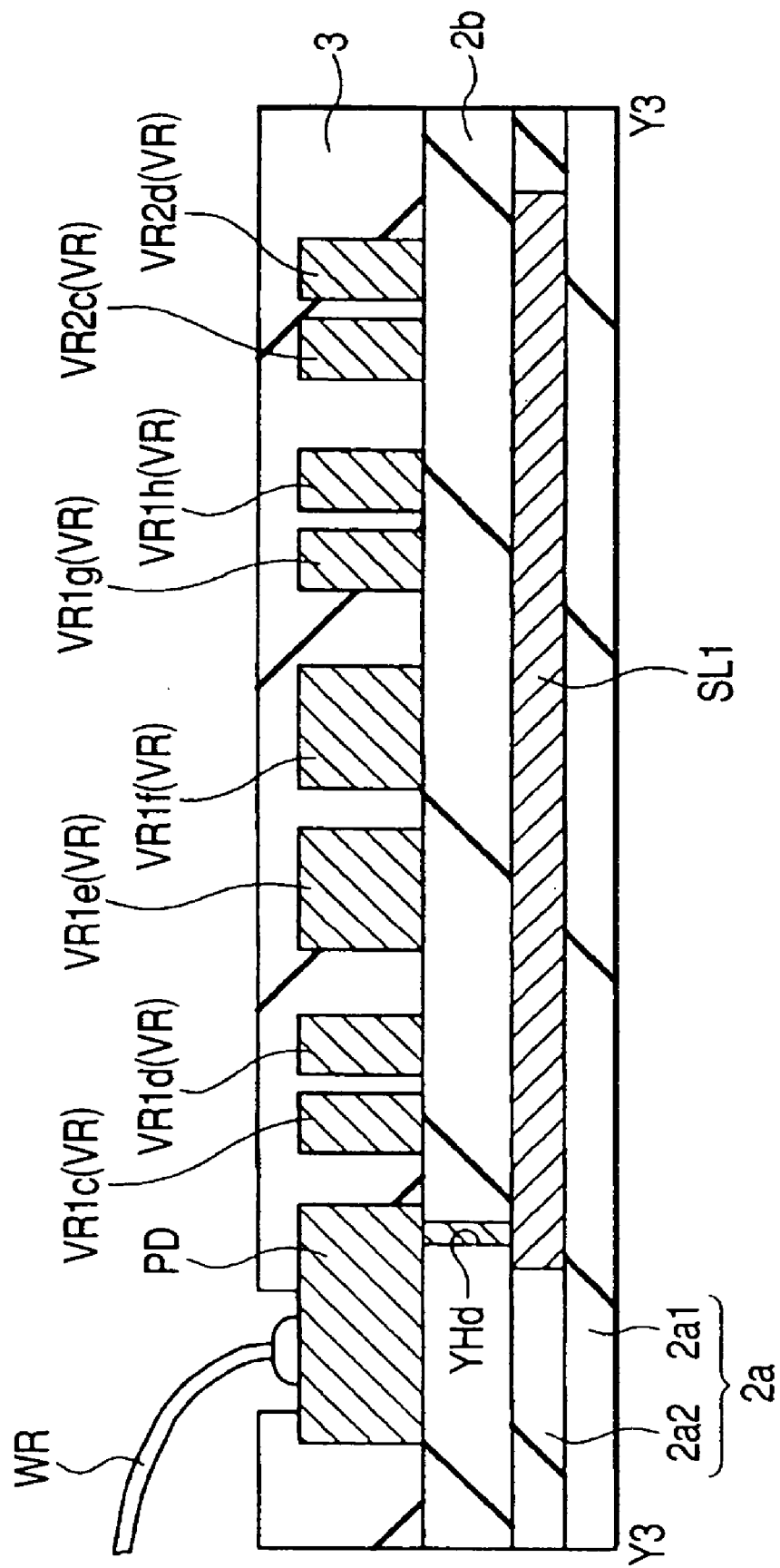
FIG. 12 is a cross-sectional view of the principal portion of the upmost wiring layer and the wiring layer immediately below it taken along the line Y3—Y3 of FIG. 11.

FIG. 10 and FIG. 11 are plan views showing schematically an input/output circuit cell I/O, and FIG. 12 is across-sectional view of the upmost wiring layer and the wiring layer immediately below it taken along the line Y3—Y3 of FIG. 11. FIG. 10 shows mainly the main surface (device forming surface) of the substrate 1S, in which indicated by NWL and PWL are n-wells and p-wells, respectively. FIG. 11 is derived from FIG. 10, with ring power lines VR being added. In FIG. 12, indicated by 2a1 and 2a2 are inter-layer insulation films.

The input/output circuit cell I/O includes a set of circuits, such as input/output buffers, for interfacing the internal circuits with the outside. An external signal having a signal level of 3.3 V for example and an internal signal having a signal level of 1.2 V for example are exchanged through the input/output circuit cell I/O. It is necessary for the input/output circuit cell I/O to be located near the pad PD and also to be supplied with at least two kinds of power voltages. A protection circuit area ESD has a layout of circuits which protect the internal circuits from surge voltages such as electrostatic voltages. An output buffer circuit area OB and input buffer circuit area IB have a layout of buffer circuits which interface the internal circuits with the outside, and these circuits operate at a power voltage of around 3.3 V for example. A level shift circuit area LS has a layout of circuits which convert the voltage level of input/output signals, and these circuits operate at a power voltage of around 1.2 V for example. Circuits in the peripheral circuit area have their pMIS located on the n-well (NWL) side and nMIS on the p-well (PWL) side. The n-wells NWL and p-wells PWL are laid out in annular arrangement along the ring power lines VR. The input/output circuit cells I/O have their circuit areas aligned in the lateral direction in FIG. 10 and FIG. 11, with power feed lines being added to complete cells. These power feed lines are derived from the ring power lines VR (VR1c, VR1d, VR1e, VR1f, VR1g, VR1h, VR2c and VR2d). Among these ring power lines VR which are laid out in parallel to each other over the peripheral circuits, six ring power lines VR1c, VR1d, VR1e, VR1f, VR1g and VR1h laid out sequentially from the pad PD toward the internal circuit area A are used to feed a relatively high power voltage of around 3.3 V for example. Among these power lines, the ring power lines VR1c, VR1f and VR1g are for the high voltage VDD1 (e.g., 3.3 V), and the ring power lines VR1d, VR1e and VR1h are for the reference voltage VSS1 (e.g., ground voltage of 0 V). Two ring power lines VR2c and VR2d laid out sequentially from the internal circuit area A toward the pad PD are used to feed a relatively low power voltage of around 1.2 V for example. Among these power lines, the ring power line VR2c is for the reference voltage VSS2 (e.g., ground voltage of 0 V), and the innermost ring power line VR2d is for the high voltage VDD2 (e.g., 3.3 V). The ring power lines VR1c and VR1d are for power conduction to the circuits in the protection circuit area ESD, the ring power lines VR1e and VR1f are for power conduction to the circuits in the output buffer circuit area OB, the ring power lines VR1g and VR1h are for power conduction to the circuits in the input buffer circuit area 1B, and the ring power lines VR2c and VR2d are for power conduction to the circuits in the level shift circuit area LS.

The input/output circuit cell I/O has its pad PD connected electrically to a lower-layer signal line SL1 via a conductor filled in a thru-hole THd. The signal line SL1 is comprised of copper as main element based on the damascene scheme for example. The signal line SL1 is connected electrically to the internal circuits by way of the protection circuit, input buffer, output buffer and level shift circuit. The pad PD and ring power lines VR are comprised of the same material as that explained on FIG. 4 and FIG. 5. The pad PD and ring power lines VR are made thicker to have a lower sheet resistance relative to the signal line SL1.

Figure 13:
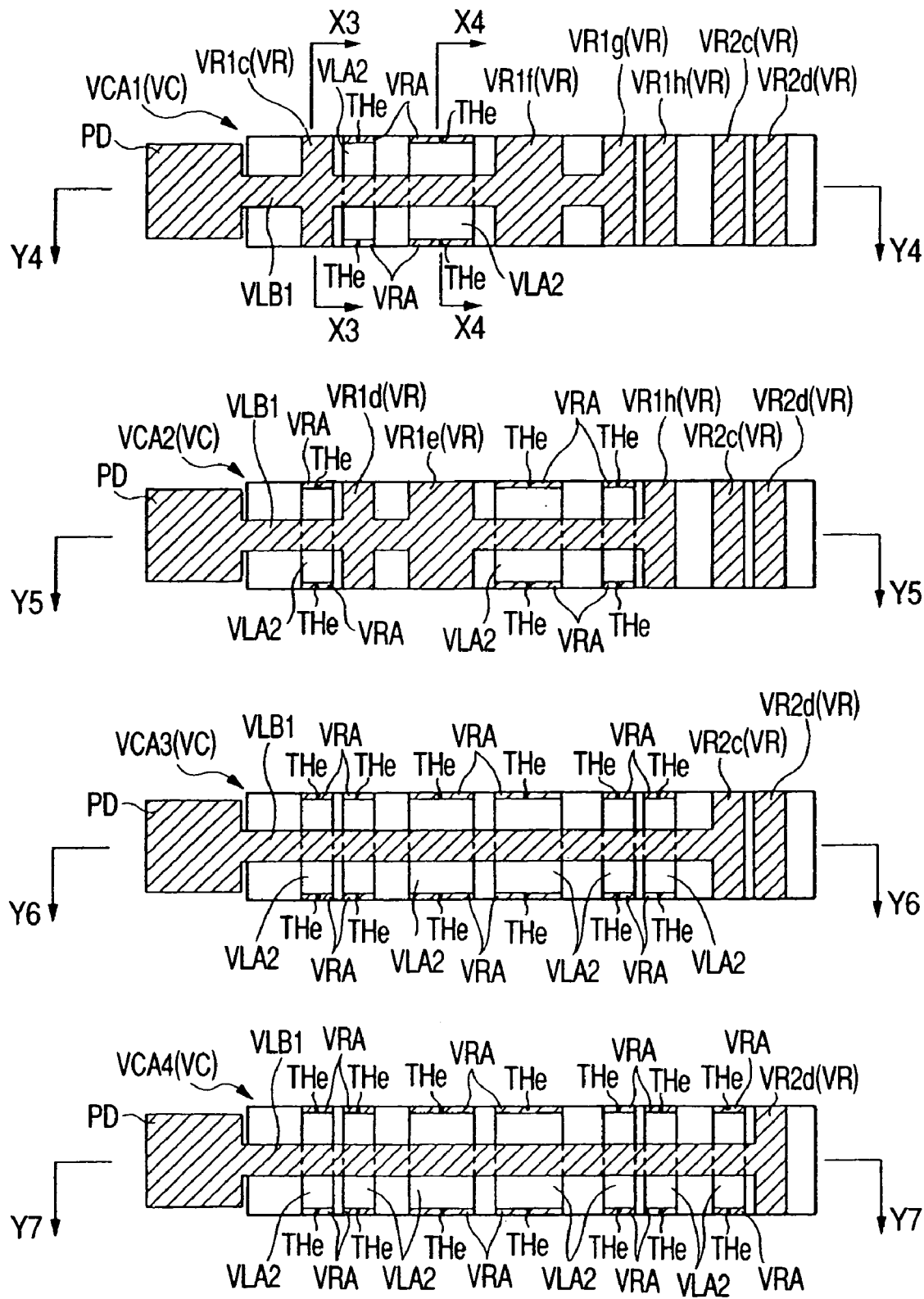
FIG. 13 is a plan view showing schematically an example of the principal portion of the power cell of the semiconductor chip (substrate) shown in FIG. 9.
Figure 14:
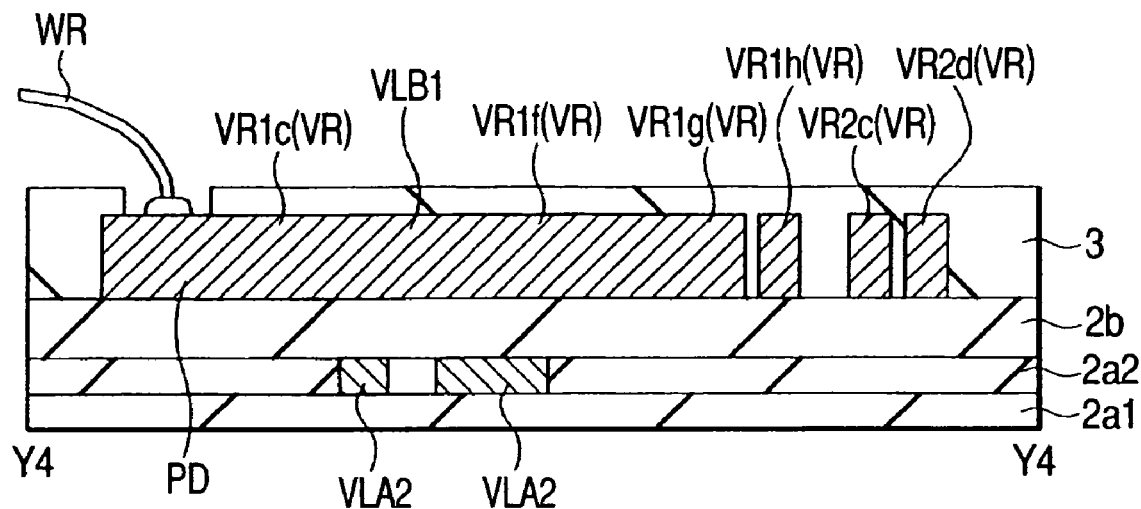
FIG. 14 is a cross-sectional view of the principal portion of the upmost wiring layer and the wiring layer immediately below it taken along the line Y4—Y4 of FIG. 13.
Figure 15:
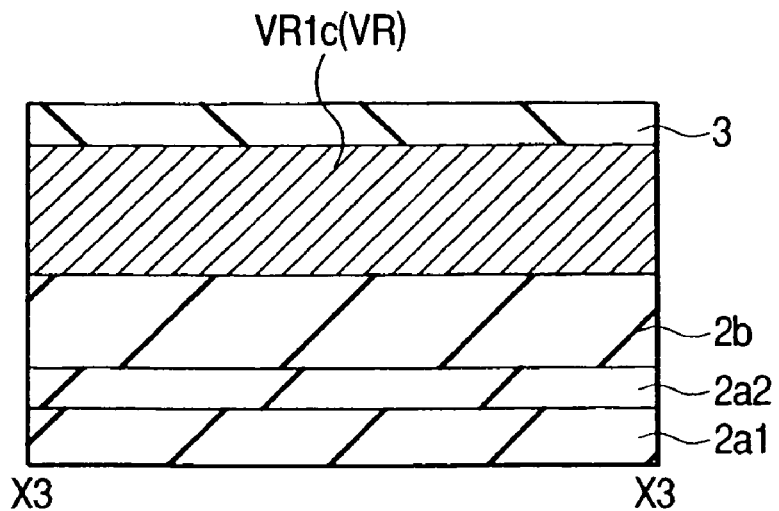
FIG. 15 is a cross-sectional view of the principal portion of the upmost wiring layer and the wiring layer immediately below it taken along the line Y5—Y5 of FIG. 13.
Figure 16:
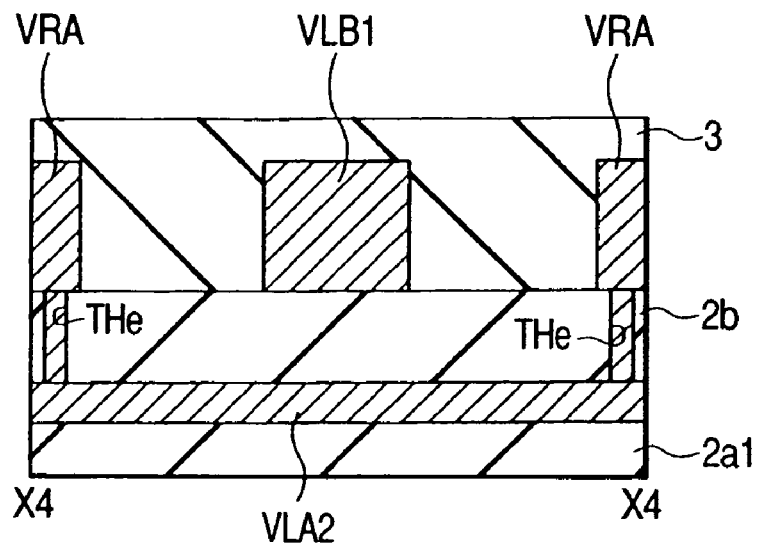
FIG. 16 is a cross-sectional view of the principal portion of the upmost wiring layer and the wiring layer immediately below it taken along the line Y6—Y6 of FIG. 13.
Figure 17:
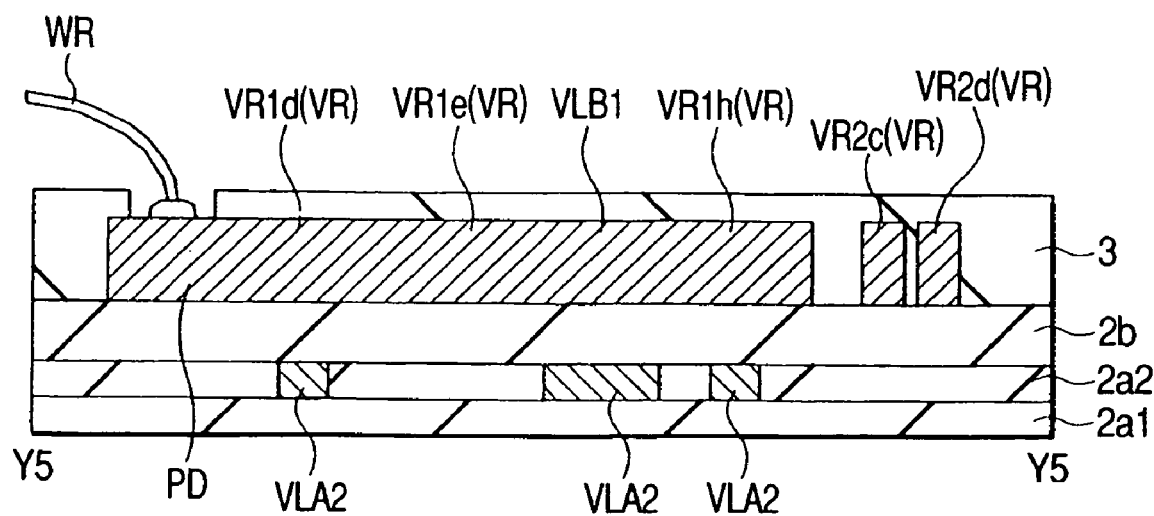
FIG. 17 is a cross-sectional view of the principal portion of the upmost wiring layer and the wiring layer immediately below it taken along the line Y7—Y7 of FIG. 13.
Figure 18:
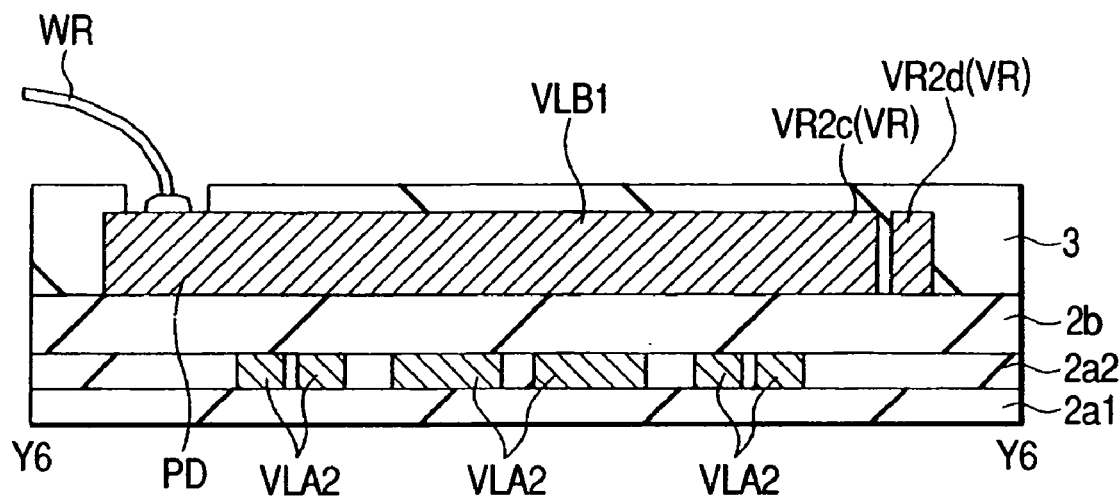
FIG. 18 is a cross-sectional view of the principal portion of the upmost wiring layer and the wiring layer immediately below it taken along the line X3—X3 of FIG. 13.
Figure 19:
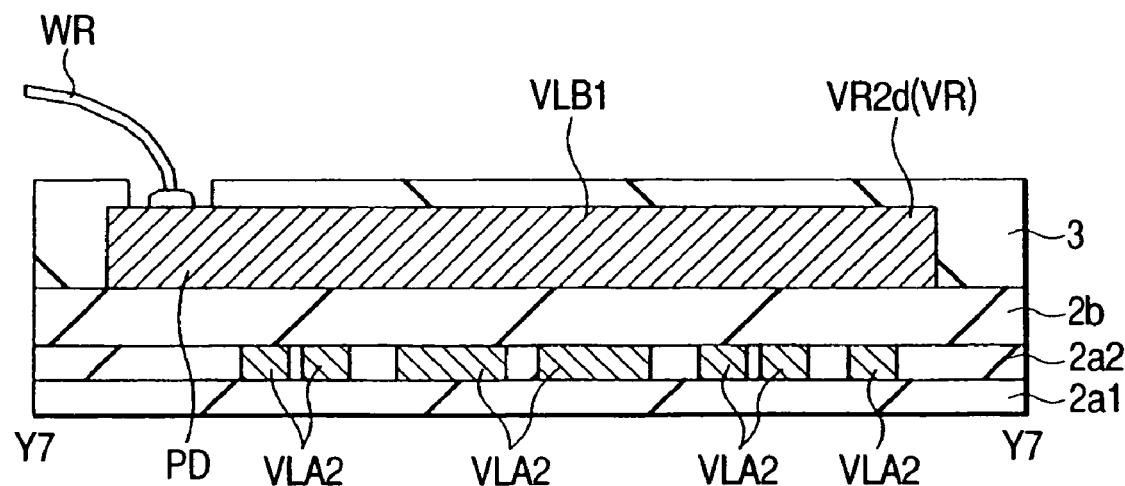
FIG. 19 is a cross-sectional view of the principal portion of the upmost wiring layer and the wiring layer immediately below it taken along the line X4—X4 of FIG. 13.
Figure 20:
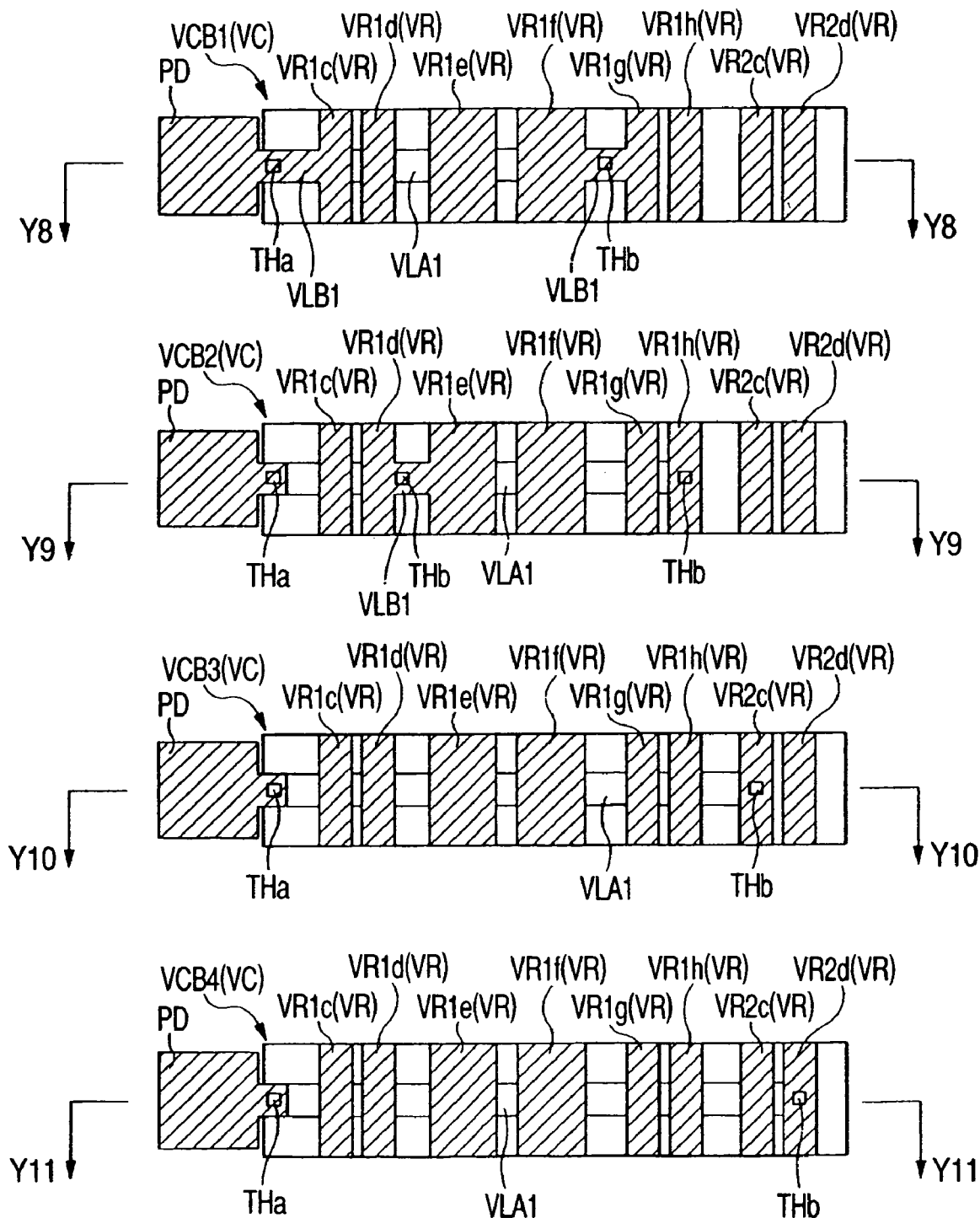
FIG. 20 is a plan view showing schematically another example of the principal portion of the power cell of the semiconductor chip (substrate) shown in FIG. 9.
Figure 21:
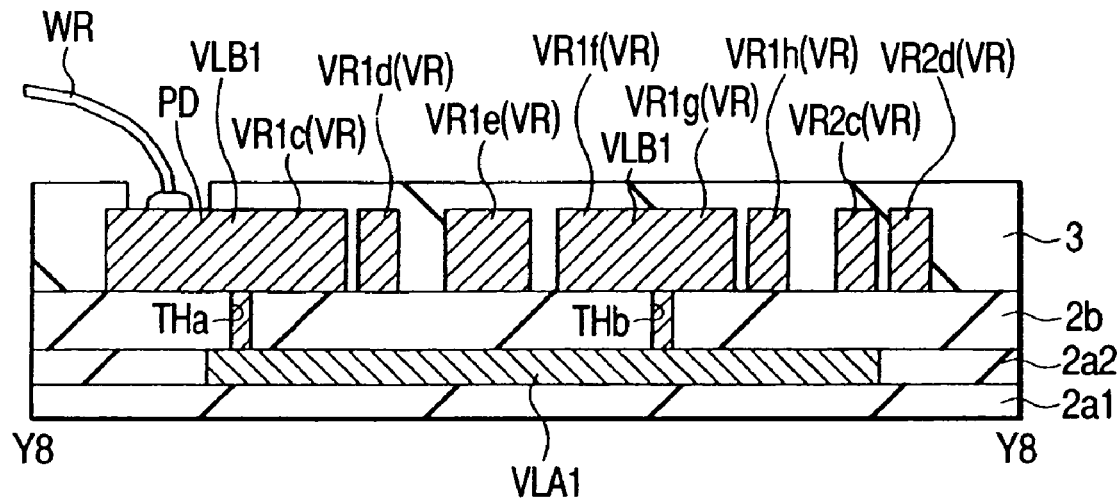
FIG. 21 is a cross-sectional view of the principal portion of the upmost wiring layer and the wiring layer immediately below it taken along the line Y8—Y8 of FIG. 20.
Figure 22:
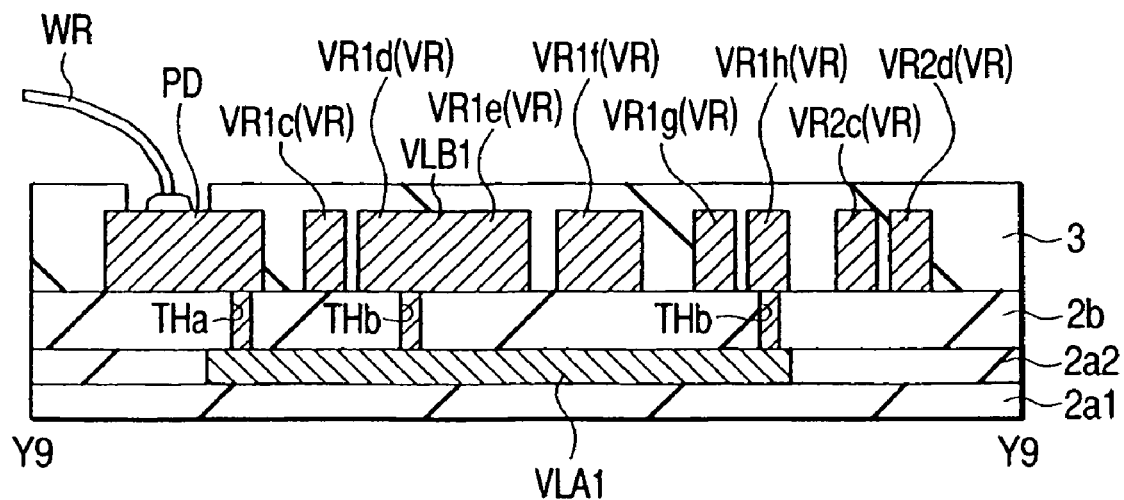
FIG. 22 is a cross-sectional view of the principal portion of the upmost wiring layer and the wiring layer immediately below it taken along the line Y9—Y9 of FIG. 20.
Figure 23:
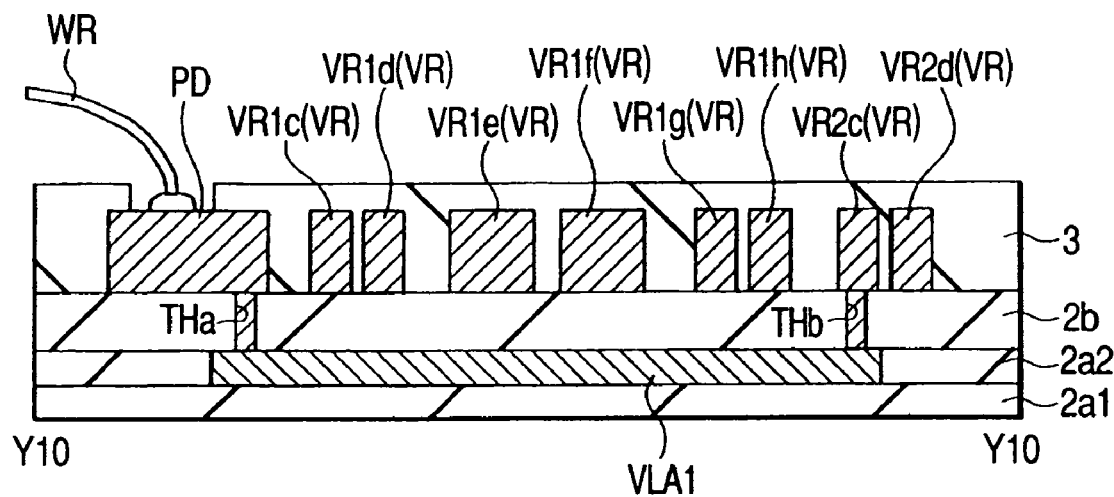
FIG. 23 is a cross-sectional view of the principal portion of the upmost wiring layer and the wiring layer immediately below it taken along the line Y10—Y10 of FIG. 20.
Figure 24:
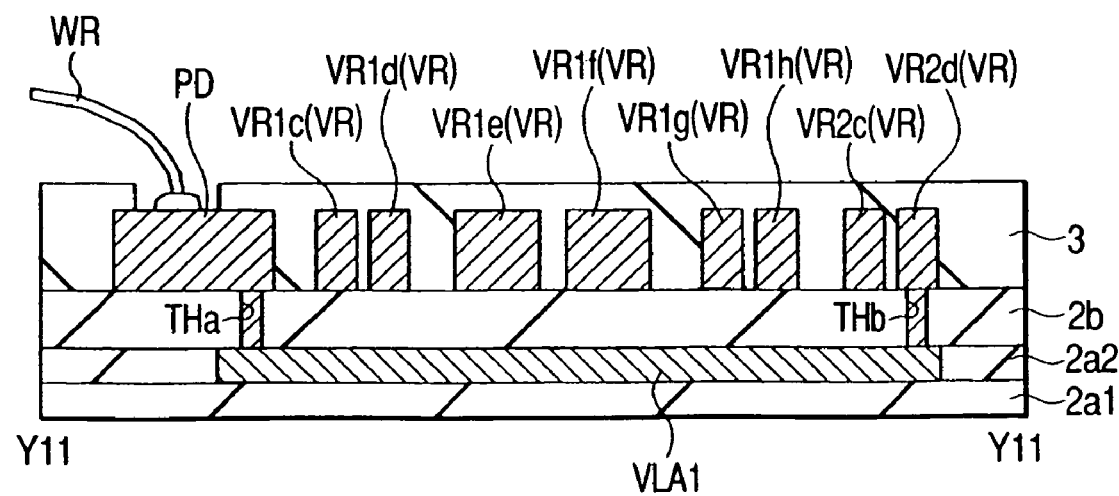
FIG. 24 is a cross-sectional view of the principal portion of the upmost wiring layer and the wiring layer immediately below it taken along the line Y11—Y11 of FIG. 20.

FIG. 13 is a plan view showing schematically power cells VC (VCA1–VCA4) of this embodiment, FIG. 14, FIG. 15 and FIG. 16 are cross-sectional views of the upmost wiring layer and the wiring layer immediately below it taken along the lines Y4—Y4, X3—X3, and X4—X4, respectively, of FIG. 13, and FIG. 17, FIG. 18 and FIG. 19 are cross-sectional views of the upmost wiring layer and the wiring layer immediately below it taken along the lines Y5—Y5, Y6—Y6, and Y7—Y7, respectively, of FIG. 13. FIG. 20 is a plan view showing schematically other power cells VC (VCB1–VCB4) of this embodiment, and FIG. 21, FIG. 22, FIG. 23 and FIG. 24 are cross-sectional views of the upmost wiring layer and the wiring layer immediately below it taken along the lines Y8—Y8, Y9—Y9, Y10—Y10 and Y11—Y11, respectively, of FIG. 20.

Power cells VC include an assortment of patterned lines (power lines VLB1) for the connection between the pads PD and the ring power lines VR, patterned lines (power lines VLA2) for the direct connection between the divided ring power lines VR, and miscellaneous circuit elements (refer to FIG. 13 and FIG. 20). This embodiment uses four power cells VC for the four kinds of ring power lines VR (3.3 V power system and 1.2 V power system each having a high VDD voltage and low VSS voltage). The four power cells VC (VCA1–VCA4) of FIG. 13 are intended for the direct connection between the power pads PD and the ring power lines VR, and the four power cells VC (VCB1–VCB4) of FIG. 20 are intended for the connection between the pads PD and certain ring power lines VR by way of the power lines VLA1. Based on the combinational layout of these power cells VC (VCA1–VCA4 and VCB1–VCB4), the power supply pads PD and the ring power lines VR are connected electrically. This embodiment uses the power cells VC (VCA1–VCA4) of FIG. 13 primarily, while the power cells VC (VCB1–VCB4) of FIG. 20 are also used occasionally in case the pads PD and the ring power lines VR need to be connected by way of the lower-layer bypass lines (e.g., for the reinforcement of power feed path). The pads PD, ring power lines VR and power lines VLA1 and VLB1 are comprised of the same material as that explained on FIG. 4 and FIG. 5. The pads PD, ring power lines VR and power lines VLB1 are made thicker to have a lower sheet resistance relative to the power lines VLA1 and VLA2.

The power cells VCA1 and VCA2 are used to feed a power voltage of 3.3 V for example. The power cell VCA1 is for the high voltage VDD1 (e.g., 3.3 V). The power cell VCA1 has its pad PD formed as unitary stuff common to the power line VLB1 and ring power lines VR1c, VR1f and VR1g of the upmost wiring layer so as to be in direct connection. Connection lines VRA shown in FIG. 13 and FIG. 16 are patterned lines for reinforcing the connection between the ring power lines VR of adjacent power cells VC and the lower-layer power lines VLA2. The connection lines VRA are comprised of aluminum as main element common to the pads PD and ring power lines VR, and are connected electrically to the lower-layer power lines VLA2 via conductors filled in thru-holes THe. The other power cell VCA2 is for the reference voltage VSS1 (e.g., ground voltage of 0 V). The power cell VCA2 has its pad PD formed as unitary stuff common to the power line VLB1 and ring power lines VR1d, VR1e and VR1h of the upmost wiring layer so as to be in direct connection.

The power cells VCA3 and VCA4 of FIG. 13 are used to feed a power voltage of 1.2 V for example. The power cell VCA3 is for the high voltage VDD2 (e.g., 1.2 V). The power cell VCA3 has its pad PD formed as unitary stuff common to the power line VLB1 and ring power line VR2c of the upmost wiring layer so as to be in direct connection. The other power cell VCA4 is for the reference voltage VSS2 (e.g., ground voltage of 0 V). The power cell VCA4 has its pad PD formed as unitary stuff common to the power line VLB1 and ring power line VR2d of the upmost wiring layer so as to be in direct connection.

The power cells VCB1 and VCB2 of FIG. 20 are used to feed a power voltage of 3.3 V for example. The power cell VCB1 is for the high voltage VDD1, and has its pad PD connected directly to the nearest ring power line VR1c through the power line VLB1 and also connected directly to the ring power lines VR1f and VR1g through the power line VLB1. The power cell VCB1 has its pad PD connected to the ring power line VR1c through the power line VLB1, also connected to the lower-layer power line VLA1 via a thru-hole THa, and further connected to the upmost ring power lines VR1f and VR1g via a thru-hole THb. The power cell VCB2 is for the reference voltage VSS1, for which the ring power lines VR1d and VR1e are connected directly through the power line VLB1. The power cell VCB2 has its pad PD connected to the lower-layer power line VLA1 via a thru-hole THa, and further connected to the upmost ring power lines VR1d, VR1e and VR1h via thru-holes THb.

The power cells VCB3 and VCB4 are used to feed a power voltage of 1.2 V for example. The power cell VCB3 is for the high voltage VDD2, and has its pad PD connected to the lower-layer power line VLA1 via a thru-hole THa, and further connected to the upmost ring power line VR2c via a thru-hole THb. The other power cell VCB4 is for the reference voltage VSS2, and has its pad PD connected to the lower-layer power line VLA1 via a thru-hole THa, and further connected to the upmost ring power line VR2d via a thru-hole THb.

Figure 25:
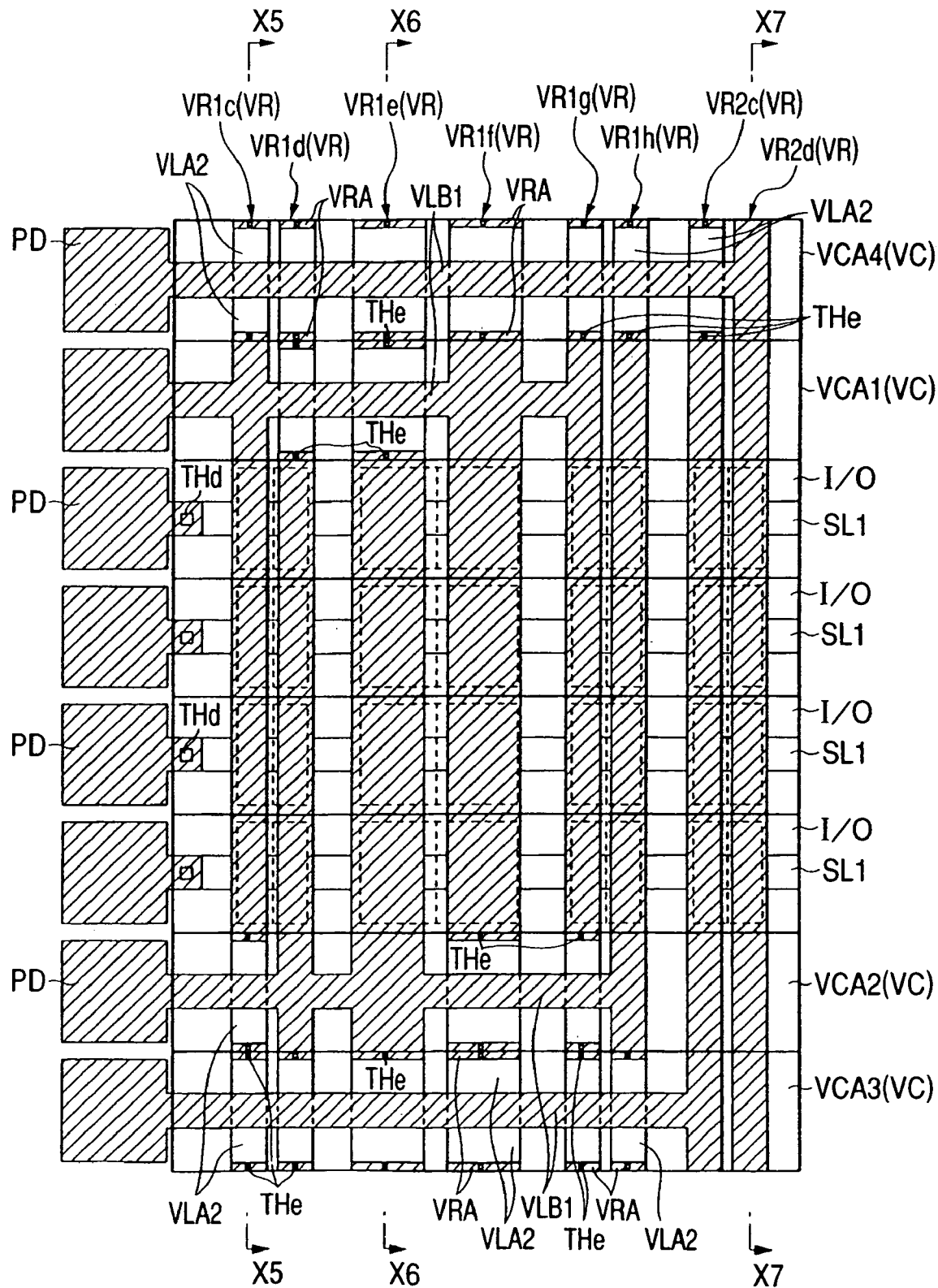
FIG. 25 is a plan view of the principal portion of a semiconductor chip (substrate), showing a layout of the input/output circuit cells and power cells in the peripheral circuit area of a semiconductor device based on an embodiment of this invention.
Figure 26:
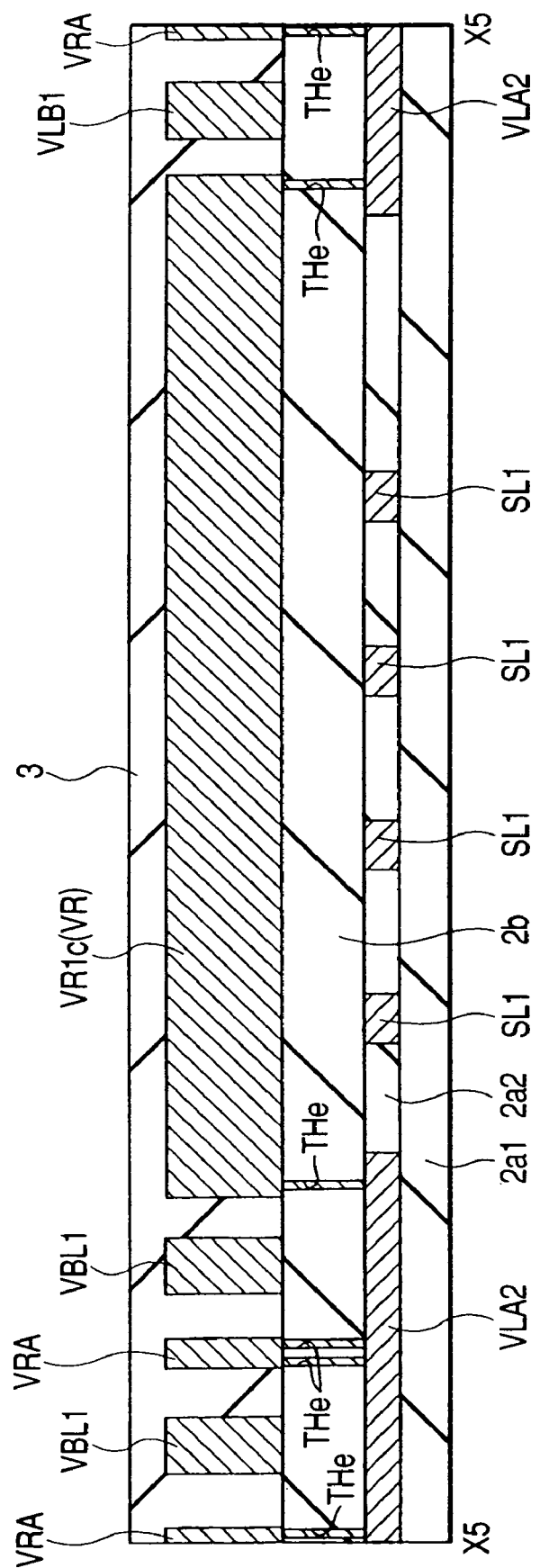
FIG. 26 is a cross-sectional view taken along the line X5—X5 of FIG. 25.
Figure 27:
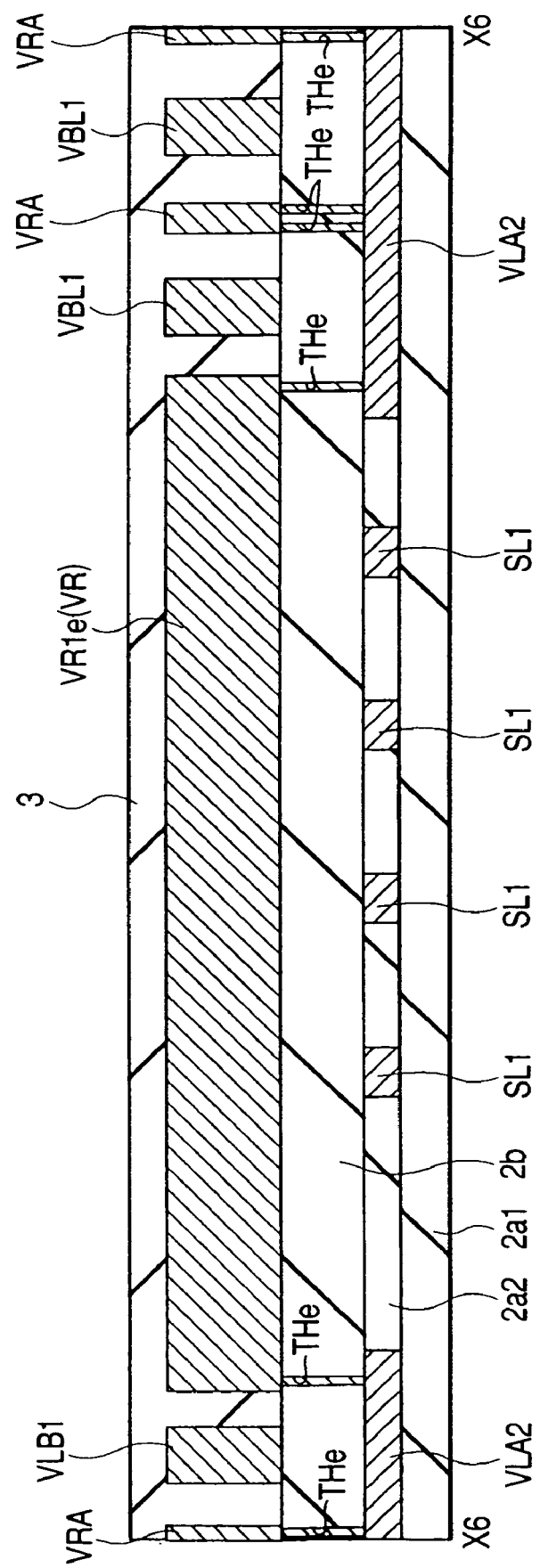
FIG. 27 is a cross-sectional view taken along the line X6—X6 of FIG. 25.
Figure 28:
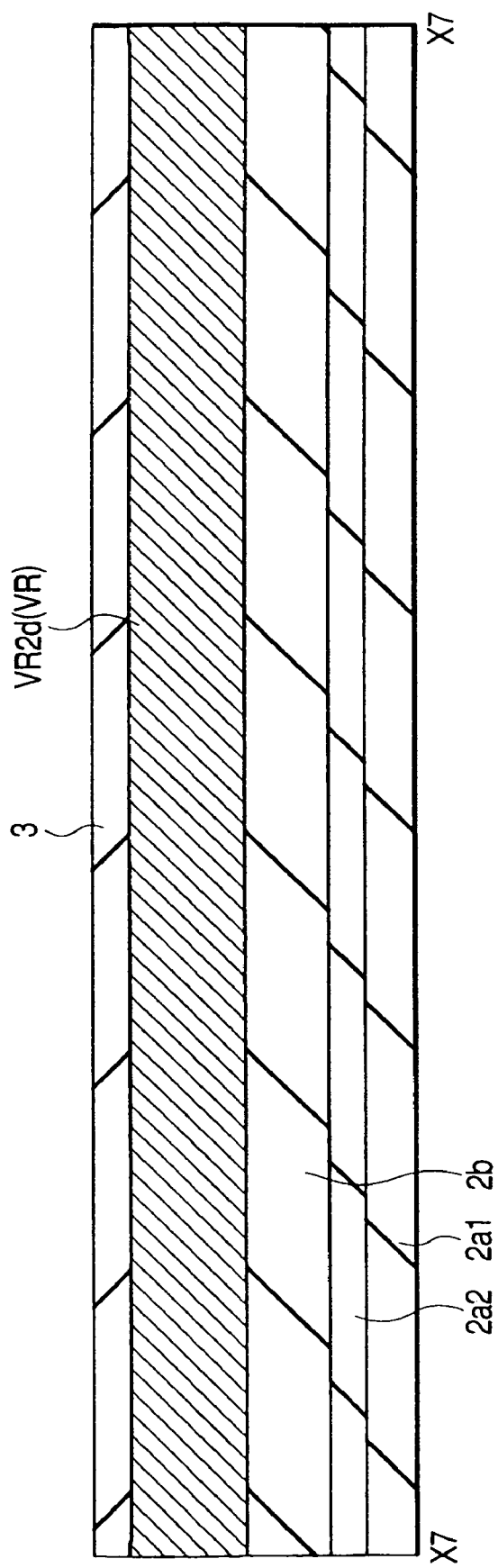
FIG. 28 is a cross-sectional view taken along the line X7—X7 of FIG. 25.
Figure 29:
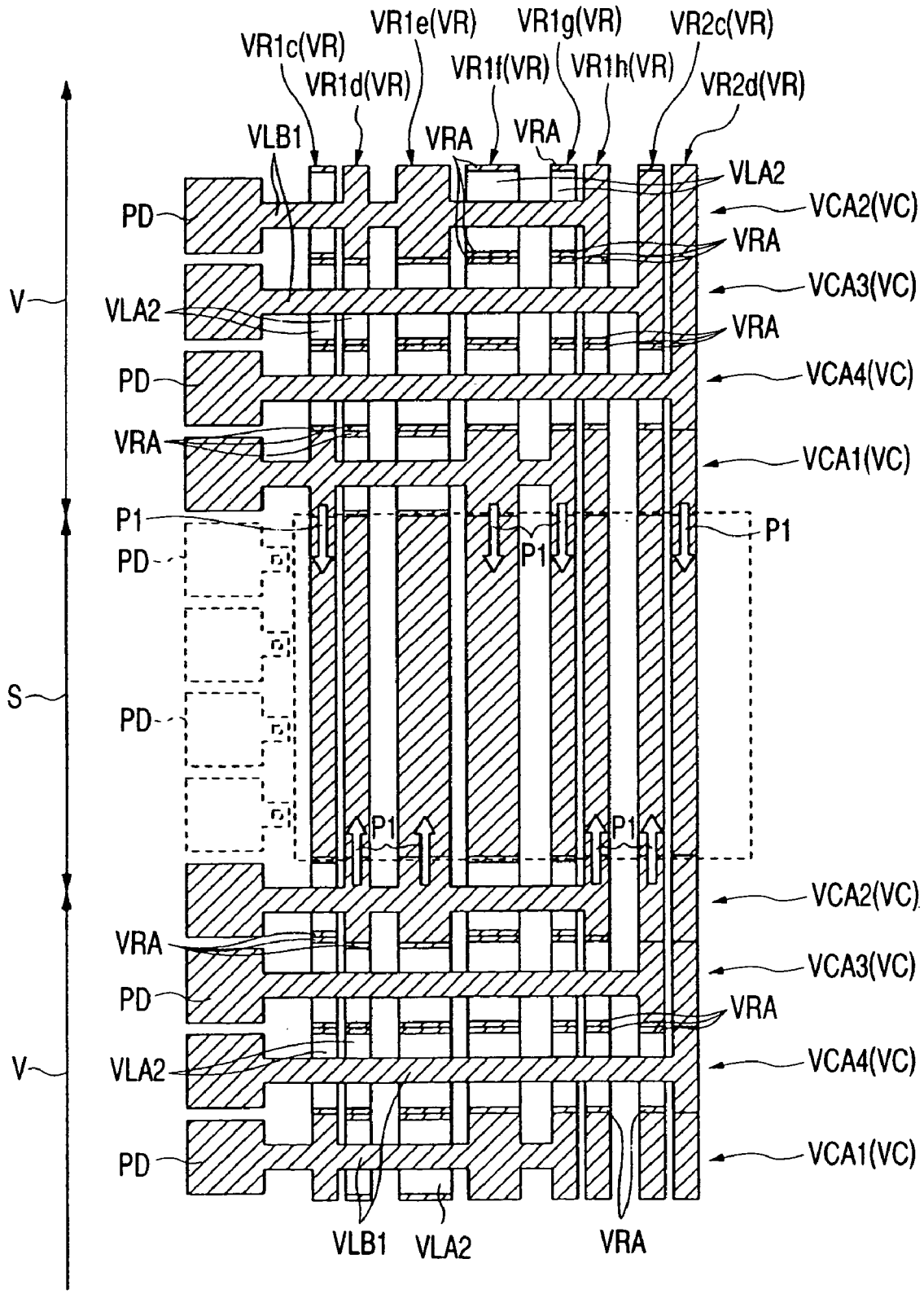
FIG. 29 is a plan view of the principal portion of the semiconductor chip (substrate), showing the power conduction in the semiconductor device shown in FIG. 25.

FIG. 25 shows a layout of the input/output circuit cells I/O and power cells VC. FIG. 26, FIG. 27 and FIG. 28 are cross-sectional views taken along the lines X5—X5, X6—X6 and X7—X7 of FIG. 25. FIG. 29 shows by the arrows P1 the power conduction within the peripheral circuit area, with the area of a set of input/output circuit cells I/O being defined by the dashed line.

Figure 30:
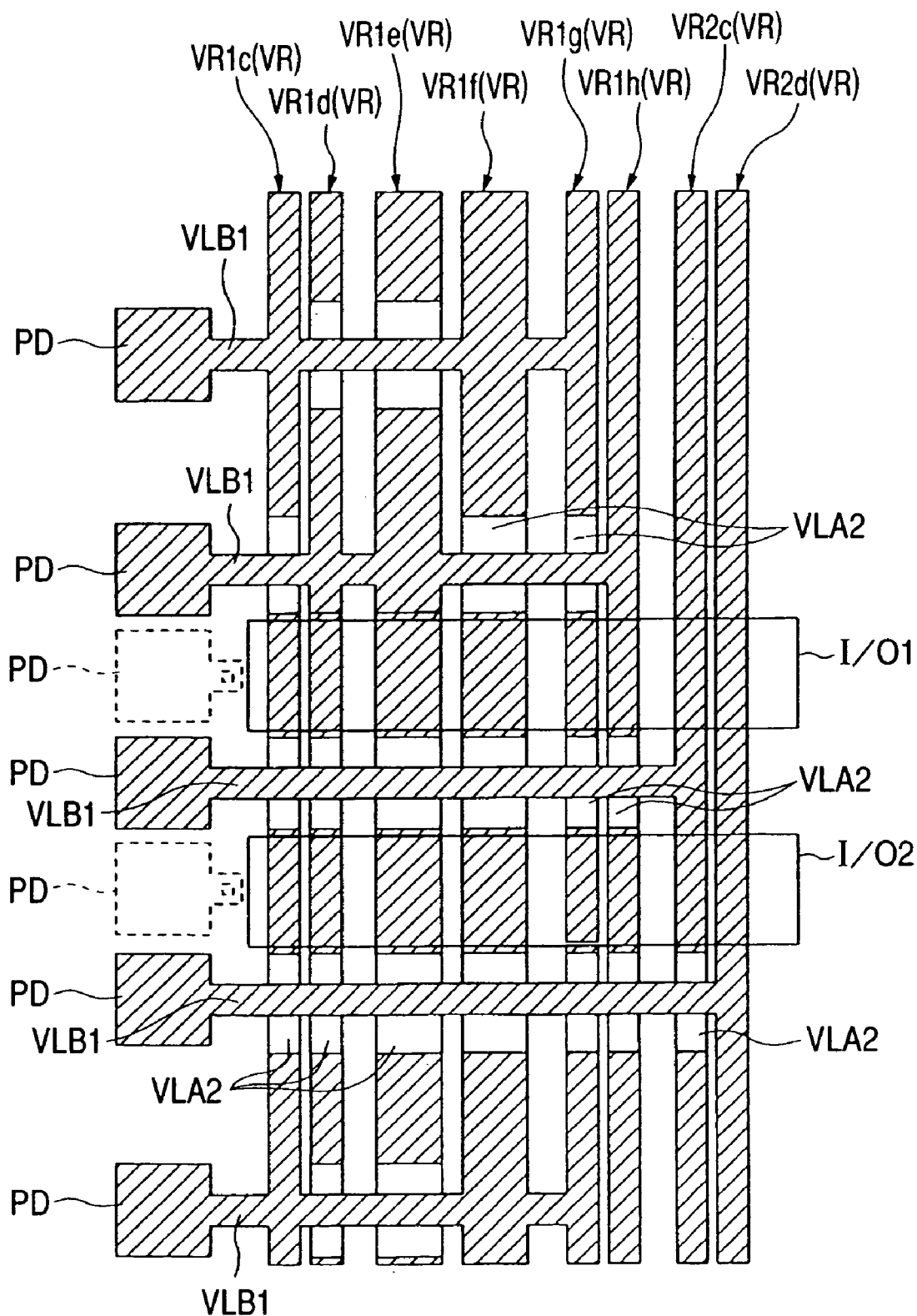
FIG. 30 is diagram used to explain the problem which arises in case power cells are not laid out contiguously.
Figure 31:
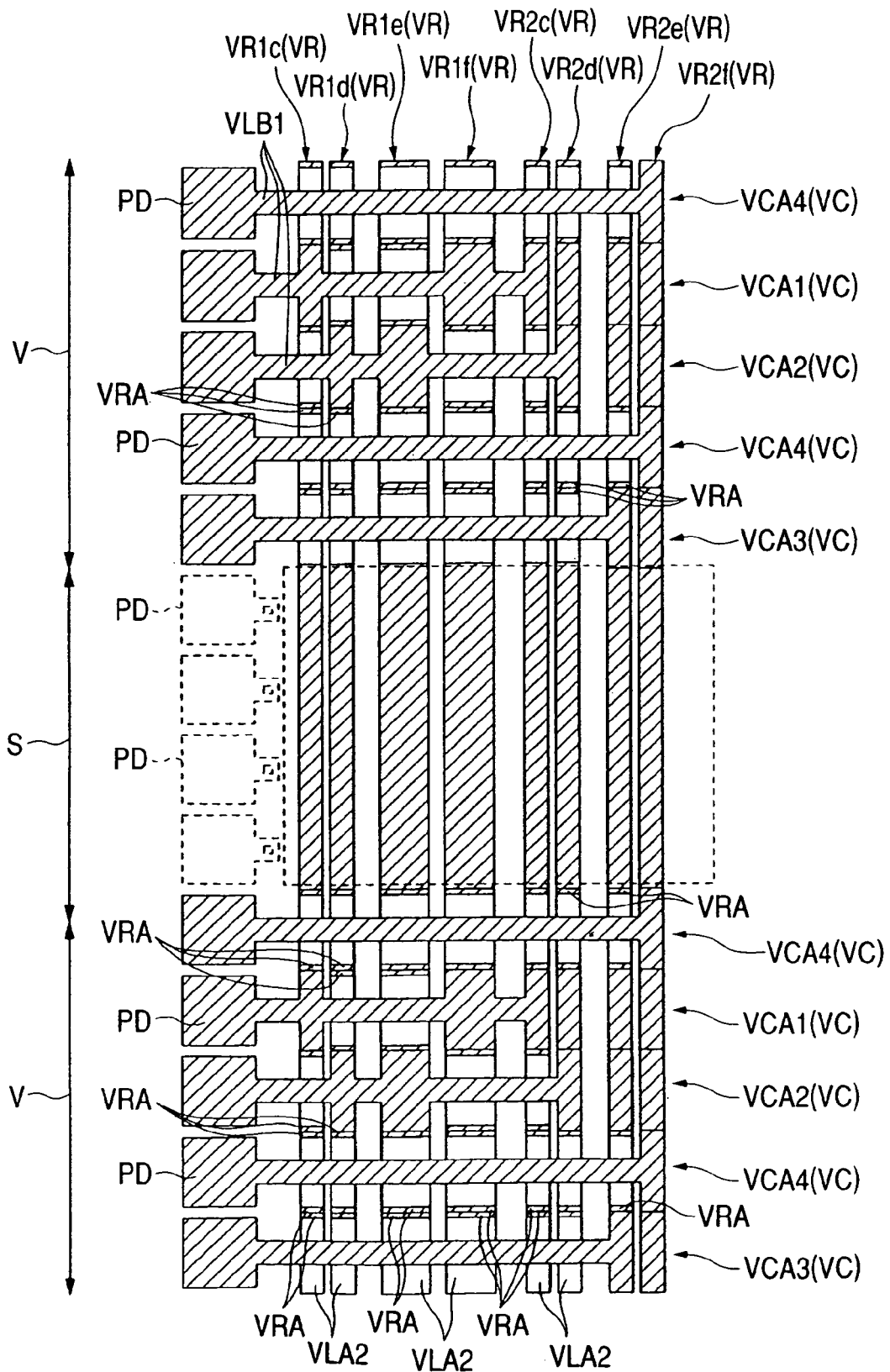
FIG. 31 is a diagram used to explain the problem which arises in case power cells VC are laid out contiguously to both ends of input/output circuit cells sequentially from those connected to the inner ring power lines.

In the semiconductor device of this embodiment, the peripheral circuit area B is laid out by arranging the input/output circuit cells I/O and power cells VC side by side in the input/output circuit are a B1. Adjacent lines VR aligning on same lines in the input/output circuit cells I/O and power cells VC are connected together, and the ring power lines VR are formed in the input/output circuit area B1. The input/output circuit cells I/O are laid out in a vacant area excluding the connection areas of the power supply pads PD and the ring power lines VR. The power cells VC and input/output circuit cells I/O cannot be laid out coincidently. In this embodiment, the ring power lines VR are all connected directly to the power supply pads PD through the power lines VLB1 of the upmost wiring layer. Consequently, the power voltages can be conducted from the power supply pads PD to the peripheral circuits and internal circuits stably, whereby the stable circuit operation of the semiconductor device which is intended for high-speed parallel data processings is made possible. The ring power lines VR which are physically divided due to the layout of the power lines VLB1 are connected to the same lower-layer power lines VLA2 via the thru-holes THe so that they are connected with each other electrically. This structure of ring power lines VR is accomplished by following the following rules. As a first rule, the power cells VC are laid out continuously. As a second rule, pairs of power cells VC (high voltage VDD and reference voltage VSS) are laid out by being close to the outmost ones (in the direction along the ring power lines VR) of a group of input/output circuit cells I/O sequentially from the pair which are connected to the outmost ring power lines VR. The necessity of the first rule will be explained with reference to FIG. 30. The figure shows a case where power cells VC are not laid out contiguously. Input/output circuit cells I/O1 and I/O2 cannot have a direct power conduction from the power supply pads PD. In order to avoid the presence of these input/output circuit cells I/O1 and I/O2, which is caused by a random layout of power cells VC instead of being adjacent to each other, the contiguous layout of power cells VC is preferable. Next, the necessity of the second rule will be explained with reference to FIG. 31. The figure shows a case where power cells VC are laid out contiguously by being close to the outmost ones of a group of input/output circuit cells I/O sequentially from the pair which are connected to the innermost ring power lines. The input/output circuit cells I/O (shown by the dashed line) cannot have a direct power conduction from the power supply pads PD. The outer six ring power lines VR are obstructed by the power lines VLB1 of the power cells VC which are laid out at the outmost ones of the group of input/output circuit cells I/O, and therefore these ring power lines VR have to reach the input/output circuit cells I/O by way of the lower-layer power lines VLA2 via thru-holes. In order to avoid the presence of these input/output circuit cells I/O shown in FIG. 31, it is necessary to lay out power cells VC contiguously by being close to the outmost ones of a group of input/output circuit cells I/O sequentially from the pair which are connected to the outmost ring power lines VR.

Figure 32:
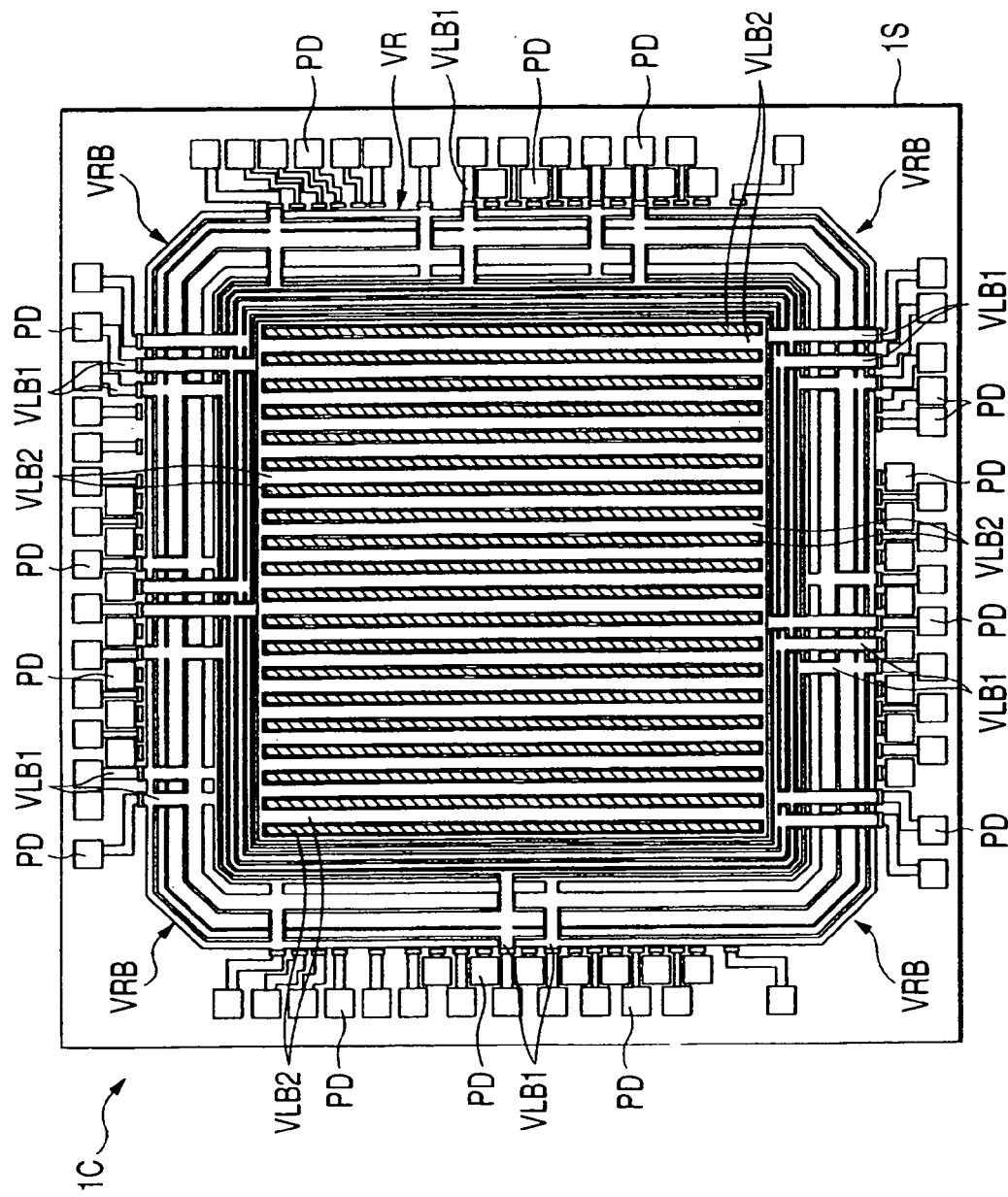
FIG. 32 is an overall plan view of a semiconductor chip (substrate), showing the upmost wiring layer of a semiconductor device based on an embodiment of this invention.
Figure 33:
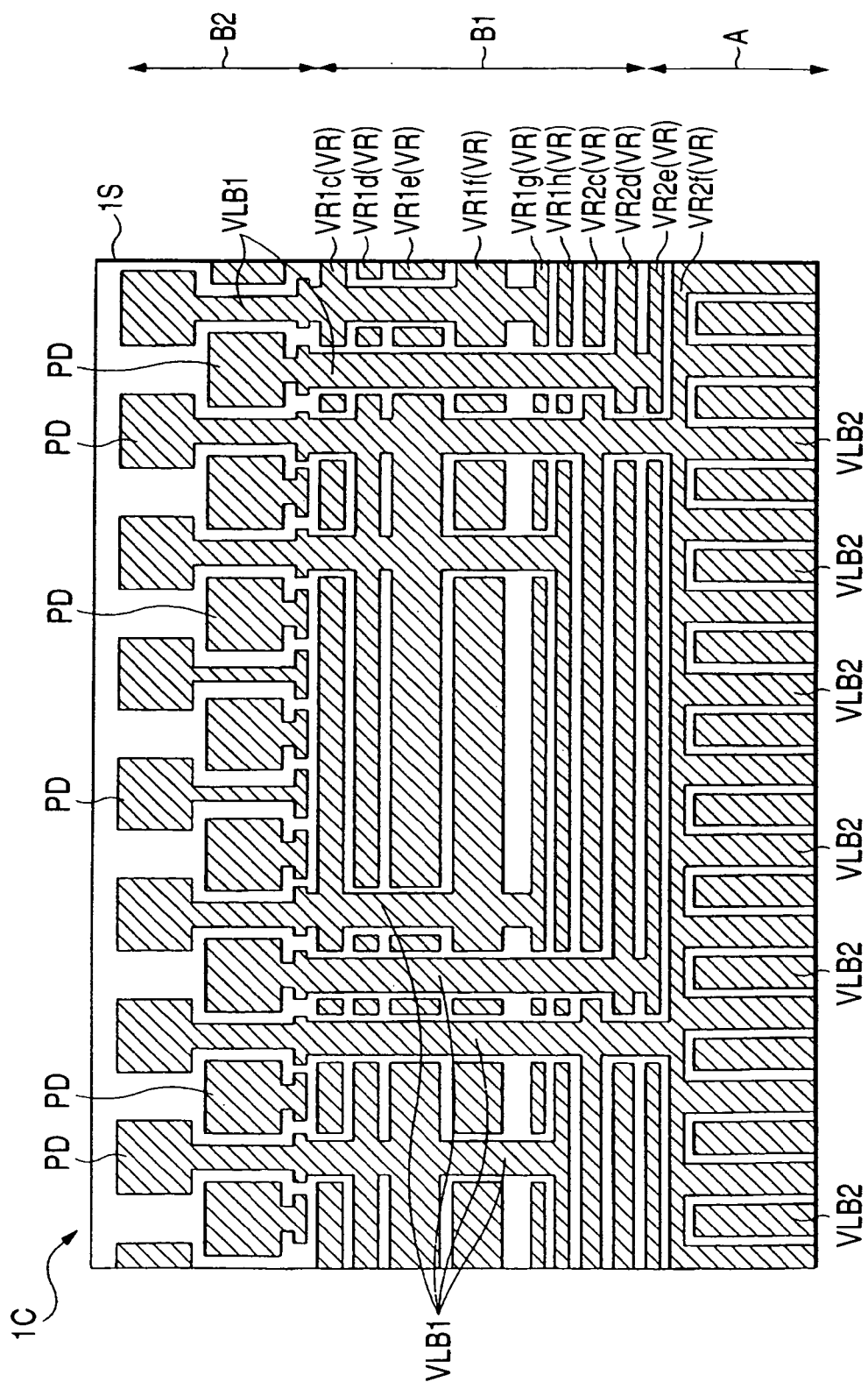
FIG. 33 is an enlarged plan view of the principal portion of the semiconductor chip (substrate) shown in FIG. 32.
Figure 34:
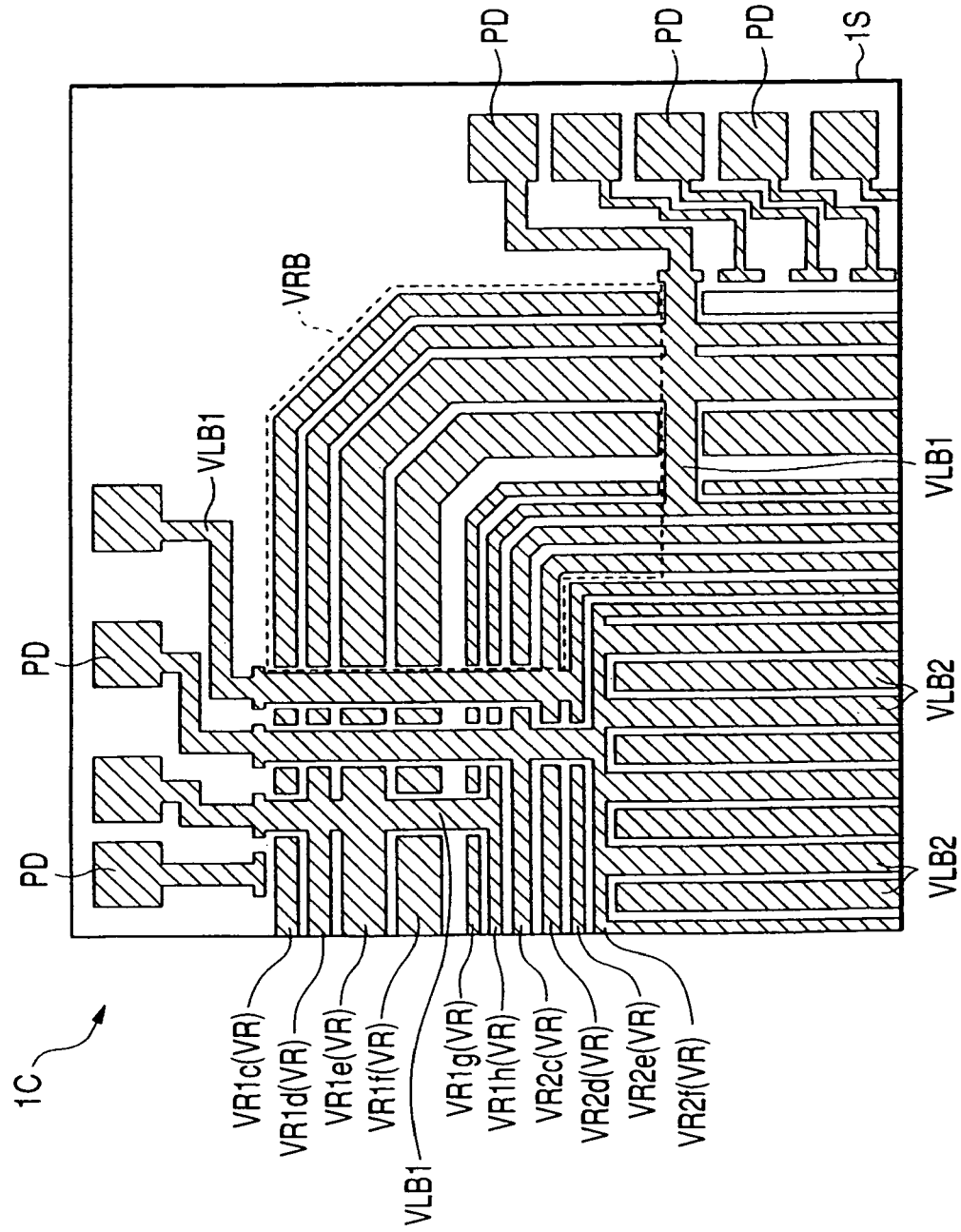
FIG. 34 is an enlarged plan view of the principal portion of the corner section of the semiconductor chip (substrate) shown in FIG. 32.
Figure 35:
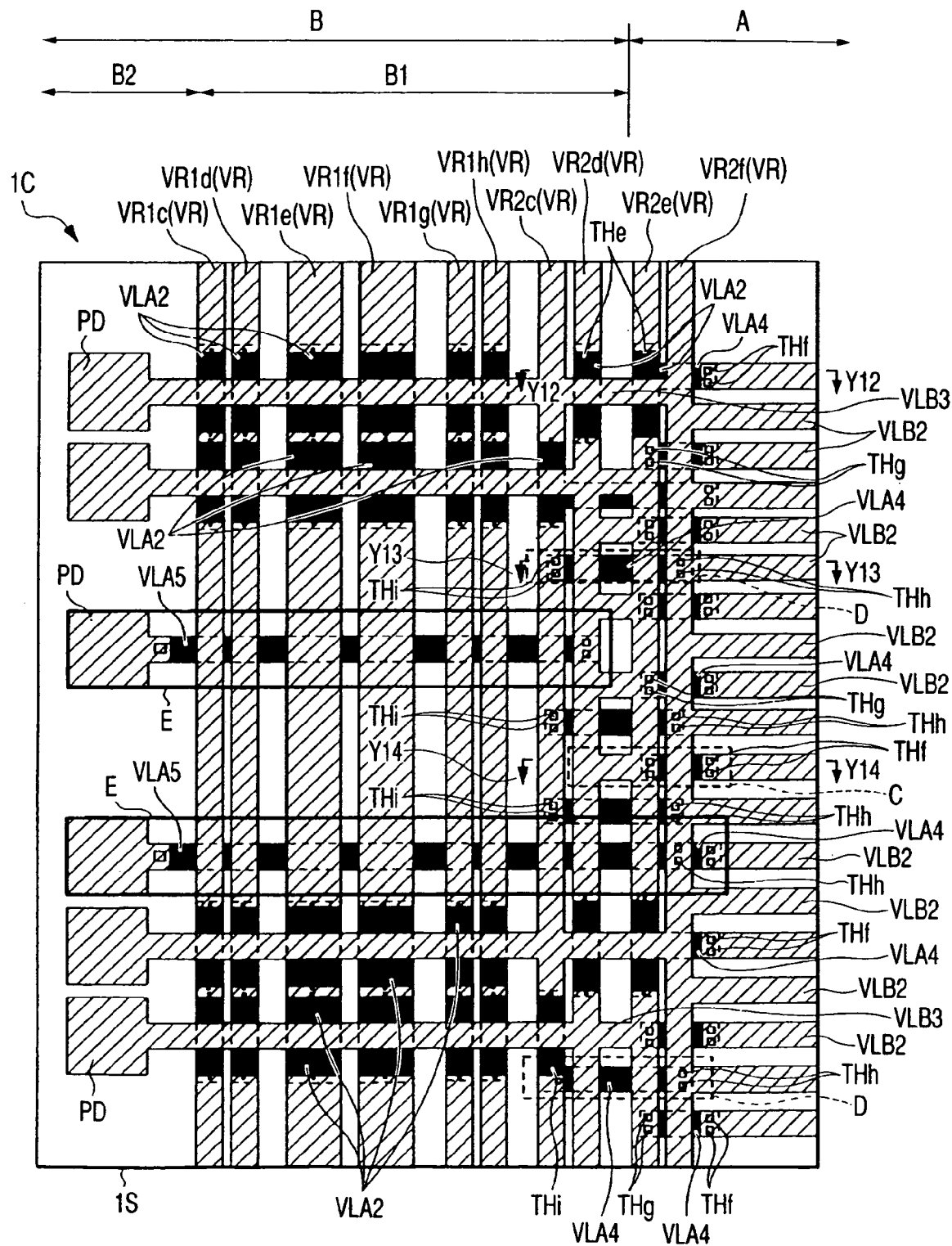
FIG. 35 is an enlarged plan view of the principal portion of a semiconductor chip (substrate), explaining the connection of the power lines of the semiconductor device shown in FIG. 32.
Figure 36:
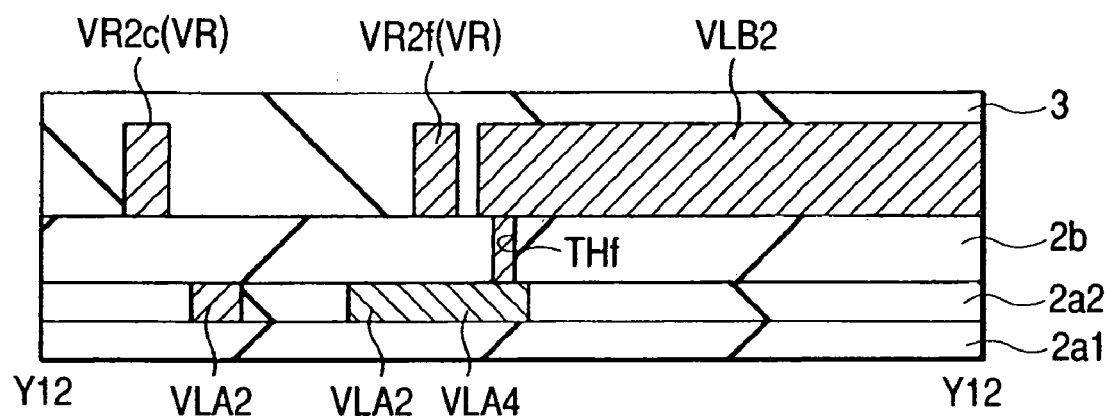
FIG. 36 is a cross-sectional view of the upmost wiring layer and the wiring layer immediately below it taken along the line Y12—Y12 of FIG. 35.
Figure 37:
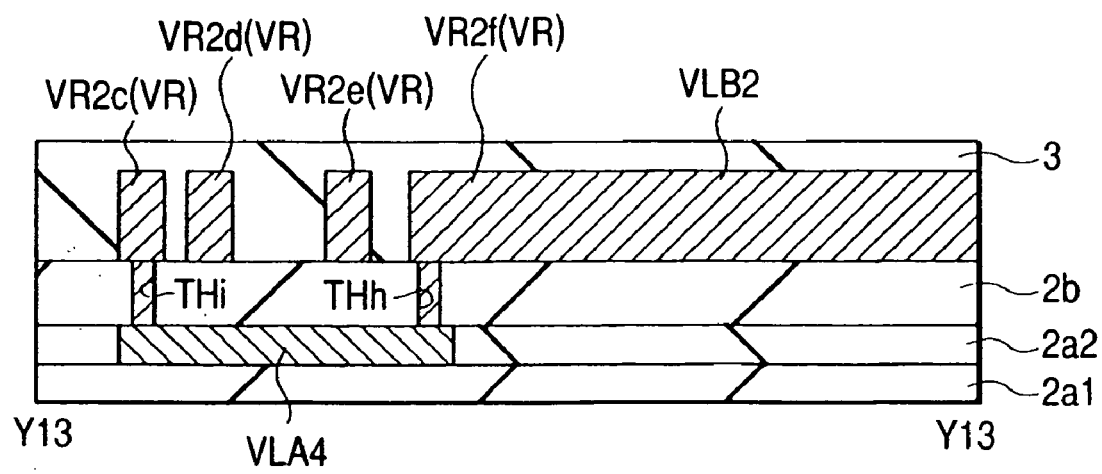
FIG. 37 is across-sectional view of the upmost wiring layer and the wiring layer immediately below it taken along the line Y13—Y13 of FIG. 35.
Figure 38:
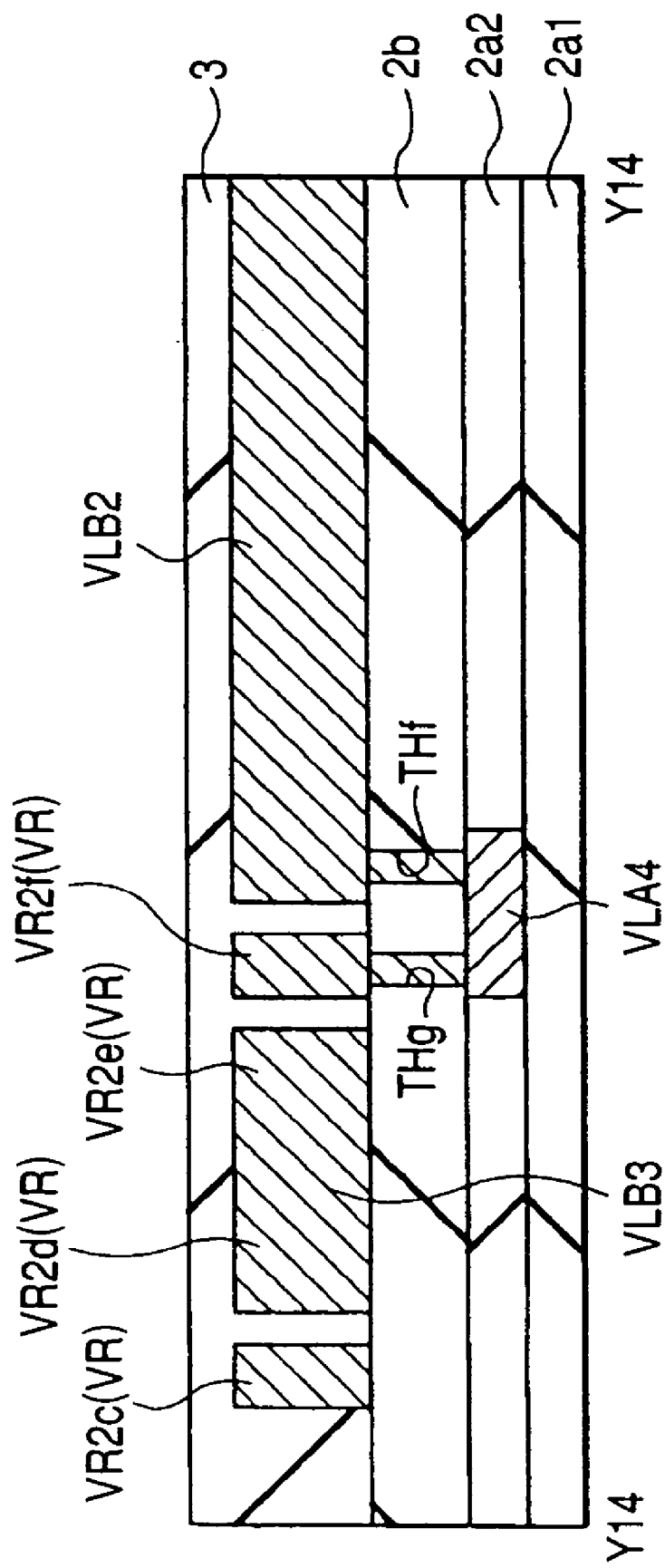
FIG. 38 is across-sectional view of the upmost wiring layer and the wiring layer immediately below it taken along the line Y14—Y14 of FIG. 35.

Next, a more specific arrangement of the semiconductor device of this embodiment will be explained. FIG. 32 is an overall plan view of a semiconductor chip (substrate) 1C, showing the upmost wiring layer of the semiconductor device based on this embodiment, FIG. 33 is an enlarged plan view of the principal portion of the semiconductor chip (substrate) 1C shown in FIG. 32, FIG. 34 is an enlarged plan view of the corner section of the semiconductor chip (substrate) 1C shown in FIG. 32, FIG. 35 is an enlarged plan view of the principal portion of the semiconductor chip (substrate), explaining the connection of power lines of the semiconductor device shown in FIG. 32, and FIG. 36, FIG. 37 and FIG. 38 are cross-sectional views of the upmost wiring layer and the wiring layer immediately below it taken along the lines Y12—Y12, Y13—Y13 and Y14—Y14 of FIG. 35. In FIG. 35, lines of the wiring layer immediately below the upmost wiring layer are shown by black-painting for the sake of clarity.

In FIG. 32 and FIG. 34, rounding connection lines VRB near the four corners of the semiconductor chip (substrate) 1C are patterned lines which are not cells. The ring power lines VR are completed by the formation of the connection lines VRB in the areas where input/output circuit cells I/O and power cells VC are absent. The connection lines VRB are comprised of aluminum as main element for example, and share the upmost wiring layer with the pads PD, ring power lines VR1a–VR1h and VR2a–VR2d, and power lines VLB1.

The ring power lines VR2e and VR2f are laid to run around the outer edge of the internal circuit area A inner than the ring power line VR2d. These ring power lines VR2e and VR2f are used to feed a power voltage of around 1.2 V for example to the internal circuits. The line VR2e which is adjacent to the line VR2d is for the high voltage VDD2 (e.g., 1.2 V), and the line VR2f which is adjacent inwardly to VR2e is for the reference voltage VSS2 (e.g., ground voltage of 0 V). These ring power lines VR2e and VR2f are intended to reinforce the power feed path owing to the effectively-widened power lines, and are comprised of aluminum as main element, for example, and share the upmost wiring layer with the pads PD, ring power lines VR1a–VR1h and VR2a–VR2d, and power lines VLB1. The ring power lines VR2e and VR2f are connected directly to the power supply pads PD through the power lines VLB1. Namely, even the innermost ring power lines VR2e and VR2f which are nearest to the internal circuit area A are supplied with power directly from the power supply pads PD located near the outer edge of the semiconductor chip (substrate) 1C.

On the upmost wiring layer in the middle of the semiconductor chip (substrate) 1C, there are laid multiple flat power lines VLB2 extending from one side to the opposite side of the internal circuit area A in parallel to each other. Namely, the internal circuit area A is covered by the power lines VLB2. The power lines VLB2 are used for feeding a power voltage of around 1.2 V for example to the internal circuits, with lines VLB2 for the high voltage VDD2 (e.g., 1.2 V) and lines for the reference voltage VSS2 (e.g., ground voltage of 0 V) being laid alternately at a certain spacing. The power lines VLB2 for the reference voltage are formed as unitary stuff common to the ring power line VR2f so as to be in direct electrical connection. Namely, the power line pads PD are connected directly to the power lines VLB2 in the middle of the semiconductor chip (substrate) 1C through the power lines VLB1 and power line VR2f. Consequently, the voltage drop on the low voltage feed path from the pad PD to the internal circuits can be reduced, and thus the stability of low voltage power supply to the internal circuits can be enhanced. The power lines VLB2 for the high power voltage are connected to a lower-layer power line VLA4 via a thru-hole THf due to the layout of the ring power line VR2f, from which it is connected to the ring power line VR2e via thru-holes THg and THe (refer to FIG. 35). This is due to the fact that the high voltage power lines VLB2 are more susceptible to voltage drop than the reference voltage power lines VLB2. On this account, in this embodiment, the ring power line VR2e which is in electrical connection with the power lines VLB2 of high power voltage which is susceptible to voltage drop and the immediately outer ring power line VR2d are connected through a power line VLB3 of the same layer comprised of aluminum as main element for example. These ring power lines VR2d and VR2f and power line VLB3 are formed as unitary stuff as indicated by C in FIG. 35. Consequently, the wiring lines have an effectively-increased line width and the power lines VLB2 and the ring power lines VR have as many connection points as possible, thereby reinforcing the high voltage (VDD2) power feed path. Consequently, the voltage drop on the high voltage feed path from the pads PD to the internal circuits can be reduced, and thus the stability of high voltage power supply to the internal circuits can be enhanced. The ring power line VR2$f$ for the reference voltage is also connected to the lower-layer power line VLA4 via thru-holes THh, from which it is connected to the ring power line VR2$c$ of the upmost wiring layer via thru-holes THi for the same purpose of reinforcement as indicated by D in FIG. 35. Consequently, the stability of reference voltage power supply to the internal circuits can further be enhanced. The foregoing scheme of 1.2 V power line reinforcement indicated by C and D in FIG. 35 can also be used for the 3.3 V power system (VDD1 and VSS1) for the input/output circuit cells I/O.

A large number of power lines VLB2 are laid to run in one direction as described previously. At both end positions in the longitudinal direction of power lines VLB2 near the edge of semiconductor chip (substrate) 1C, multiple pads PD for the 1.2 V power system (VDD2 and VSS2) for example are laid. Consequently, the power lines VLB2 can be reinforced, and thus the stability of power supply to the internal circuits can be enhanced, and thus the operational stability of the internal circuits can be improved. At both end positions in the longitudinal direction of power lines VLB2 near the edge of semiconductor chip (substrate) 1C, where power is conducted directly from the power supply pads PD to the lines VLB2, it is necessary to connect the pads PD of the high power voltage and low power voltage to the ring power lines VR2$e$ and VR2$f$ even by use of a lower-layer power line VLA5, as indicated by E in FIG. 35, thereby to increase the number of power feed paths from the power supply pads PD to the power lines VLB2. Consequently, the power lines VLB2 can be reinforced, and thus the stability of power supply to the internal circuits can be enhanced. The number of power supply pads PD for internal circuits laid out at both end positions in the longitudinal direction of power lines VLB2 is made larger than the number of power supply pads PD for internal circuits laid out at both end positions in the width direction of power lines VLB2. The power supply pads PD for the peripheral circuits are laid out by being divided in equal number on the four sides of the semiconductor chip (substrate) 1C. The number of power lines VLB2 for the high power voltage and reference power voltage is made larger than the number of power supply pads PD for the high power voltage and reference power voltage. Consequently, it becomes possible even for a small number of power supply pads PD to supply power stably to the internal circuits in the internal circuit area A of the semiconductor chip (substrate) 1C. The size of semiconductor chip (substrate) 1C can be dependent on the number of pads PD in general, since the reduction in size and spacing of pads PD is limited. Whereas, the power conduction scheme of this embodiment can feed power to the internal circuits without using a large number of pads PD, whereby it becomes possible to accomplish a high-reliability and high-performance semiconductor device without incurring an increased size of semiconductor chip (substrate) 1C.

Figure 39:
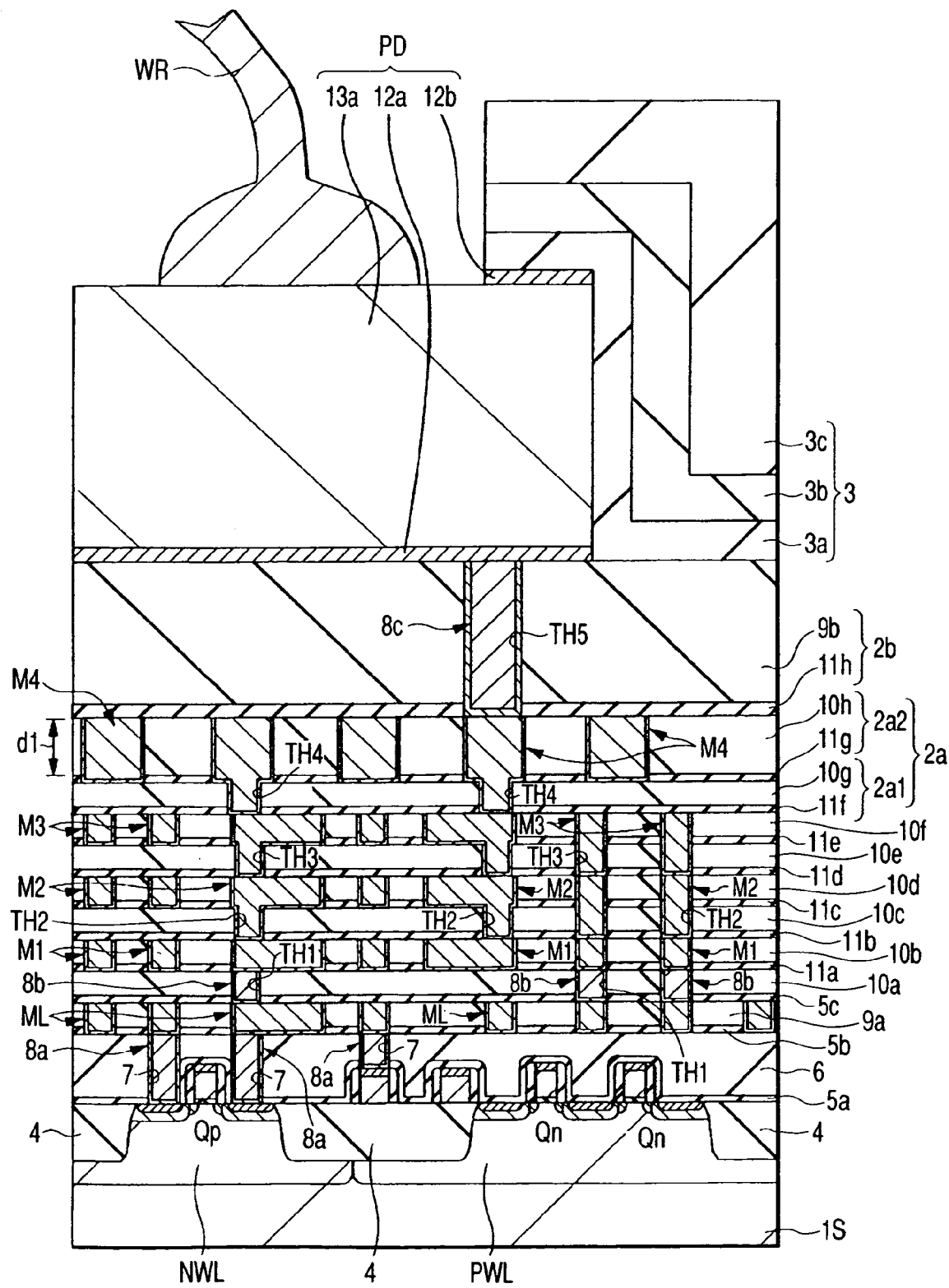
FIG. 39 is a cross-sectional view of the principal portion of the internal circuit area of a semiconductor device based on an embodiment of this invention.

Next, the vertical structure of the semiconductor device of this embodiment will be explained. FIG. 39 is a cross-sectional view of the internal circuit area of this semiconductor device.

A substrate 1S is made from p-type monocrystalline silicon having a relative resistance of around 1–10 Ωcm for example. On the main surface side (device forming side) of the substrate 1S, there are formed separation grooves (SGI: shallow groove insulator or STI:shallow trench isolation) 4. The separation grooves 4 are made by forming grooves in the substrate 1S and filling the grooves with silicon oxide films for example. On the main surface of the substrate 1S, a p-type well PWL and n-type well NWL are formed. Boron, for example, is put in the p-type well PWL, while phosphor, for example, is put in the n-type well NWL. In the active regions of the p-type well PWL and n-type well NWL surrounded by the separation grooves 4, an nMISQn and pMISQp are formed.

On the main surface of the substrate 1S, by being interposed by an insulation film 5$a$ of silicon nitride for example, there is deposited an insulation film 6 to have a larger thickness relative to the insulation film 5$a$. The insulation film 6 is comprised of a film which is rich in property of reflow, allowing the filling of narrow spaces of the gate electrodes of nMISQn and pMISQp, e.g., BPSG (Boron-doped Phospho Silicate Glass) film. Alternatively, it may be comprised of an SOG (Spin On Glass) film based on the spin application scheme. Contact holes 7 are formed in the insulation film 6 so that the substrate 1S or the gate electrodes are partially exposed. The contact holes 7 are filled with plugs 8$a$, which are formed of a relatively thinner barrier film such as a titanium nitride (TiN) and a relatively thicker conductor film of tungsten (W) which are deposited on the insulation film 6 inclusive of the interior of contact holes 7 sequentially from the lower layer based on the CVD process or the like, and thereafter unneeded titanium nitride film and tungsten film on the insulation film 6 are removed by the CMP process or etch-back process, thereby leaving the film material only in the interior of contact holes 7.

On the insulation film 6, a relatively thinner insulation film 5$b$ and relatively thicker insulation film 9$a$ of the same material as the insulation film 5$a$ are deposited sequentially from the lower layer. The insulation film 9$a$ is comprised of silicon oxide (SiO$_2$) for example. These insulation films 5$b$ and 9$a$ have a formation of wiring grooves, in which lowest-layer buried lines ML are formed. The lowest-layer buried lines ML have such a structure that a relatively thick conductor film of tungsten for example is overlaid on the side and bottom surfaces by a film of titanium (Ti) or titanium nitride (TiN) or by a laminated film of titanium nitride on titanium. The lowest-layer buried lines ML are connected electrically to the source and drain regions and gate electrodes of the nMISQn and pMISQp through the plugs 8$a$. The conductor film material for the lowest-layer buried lines ML is not limited to tungsten, but various alterations are possible, e.g., it may be aluminum (Al) or aluminum alloy.

On the insulation film 9$a$ and lowest-layer buried lines ML, insulation films 5$c$ and 10$a$ are formed sequentially from the lower layer. The insulation film 5$c$ is a silicon nitride film for example, and the insulation film 10$a$ has such a structure that a silicon oxide film or the like is laminated on a Low-K insulation film of SiOF for example. The insulation film 10$a$ of Low-K insulation film can have a smaller permittivity as compared with that of silicon oxide film. The Low-K insulation film can be of an organic polymer material such as, for example, SILK (product of The Dow Chemical Co., USA, permittivity:2.7, thermal durability:490° C. or higher, insulation withstand voltage: 4.0–5.0 MV/Vm) or a poly arylene ether (PAE) material such as FLARE (product of Honeywell Electronic Materials, USA, permittivity:2.8, thermal durability: 400° C. or higher), or an organic silica glass material such as HSG-R7 (product of Hitachi Chemical Co., Japan, permittivity:2.8, thermal durability:650° C.), Black Diamond (product of Applied Materials Inc., USA, permittivity:3.0-2.4, thermal durability: 450° C.), or p-MTES (product of Hitachi Development Co., Japan, permittivity:3.2). All of these materials are effective for reducing the permittivity.

These insulation films 5c and 10a have a formation of thru-holes TH1, which are filled with plugs 8b of the same material as the plugs 8a. On the insulation film 10a and plugs 8b, an insulation film 10b is deposited by being interposed by an insulation film 11a of silicon carbonate (SiC) for example. The insulation film 11a of silicon carbonate can have a smaller permittivity as compared with that of silicon nitride film. The silicon carbonate film can be, for example, BLOk (product of AMAT Co., permittivity:4.3). Another material for the insulation film 11a can be silicon carbonate-nitride (SICN), or oxide-nitride (SiON). All of these materials are effective for reducing the permittivity. The insulation film 10b has the same structure and material as the insulation film 10a. The insulation films 11a and 10b have a formation of wiring grooves in which first-layer buried lines M1 are formed (single damascene structure). The first-layer buried lines M1 have such a structure that a relatively thick conductor film of copper (Cu) for example is overlaid on the side and bottom surfaces by a conductive barrier film of nitride (TiN), tantalum (Ta) or tantalum nitride (TaN) or laminated versions thereof. The first-layer buried lines M1 are connected electrically to the lowest-layer buried lines ML via plugs 8b.

On the insulation film 10b and first-layer buried lines M1, an insulation film 10c is deposited by being interposed by an insulation film 11b. On the insulation film 10c, an insulation film 10d is deposited by being interposed by an insulation film 11c. The insulation film 11b and 11c have the same structure and material as the insulation film 11a, and the insulation films 10c and 10d have the same structure and material as the insulation film 10a. The insulation films 10d and 11c have a formation of wiring grooves, and the insulation films 10c and 11b have a formation of thru-holes TH2 which extend downward from the bottom of the wiring grooves. Second-layer buried lines M2 are formed in the wiring grooves. The second-layer buried lines M2 have the same structure and material as the first-layer buried lines M1. The second-layer buried lines M2 are connected electrically to the first-layer buried lines M1 through conductor film portions in the thru-holes TH2 (dual damascene structure). Third-layer buried lines M3 and fourth-layer buried lines M4 above the line M2 have a buried copper line structure similar to the line M2. The fourth-layer buried lines M4 have a thickness d1 (thickness of line excluding the thru-hole portion, which is virtually equal to the sum of thicknesses of insulation films 11g and 10g or the depth of the wiring grooves) of around 0.45 μm for example, and it is made thicker than the first-layer buried lines M1, second-layer buried lines M2 and third buried lines M3 (their thicknesses are virtually equal to the depth of the respective wiring grooves, and are around 0.2 μm for example). The fourth-layer buried lines M4 have a sheet resistance of around 60 mΩ/square for example. The fourth-layer buried lines M4 is the wiring layer immediately below the upmost wiring layer. The power lines VLA1, VLA2, VLA3, VLA4, etc.described above have the same vertical structure as the fourth-layer buried lines M4. Based on the multi-layer line structure using copper as main element, the wiring resistance can be reduced and the operational speed of the semiconductor device can be increased. The insulation films 10e, 10f, 10d and 10h have the same structure and material as the insulation film 10a. The insulation films 11d, 11e, 11f, 11g and 11h have the same structure and material as the insulation film 11a. The inter-layer insulation film 2a1 is structured to have insulation films 11f and 10g, and the inter-layer insulation film 2a2 is structured to have insulation films 11g and 10h. The third-layer buried lines M3 are connected electrically to the second-layer buried lines M2 via thru-holes TH3 which are formed in the insulation films 11d and 10e. The fourth-layer buried lines M4 are connected electrically to the third-layer buried lines M3 via thru-holes TH4 which are formed in the insulation films 11f and 10g. Based on the use of the Low-K material for the inter-layer insulation films, the wiring capacitance can be reduced, and thus the operational speed of the semiconductor device can be increased. On the insulation film 10h and on the insulation film 11h on the fourth-layer buried lines M4, an insulation film 9b is deposited. The inter-layer insulation film 2b is structured to have insulation films 11h and 9b. The insulation film 9b has the same structure and material as the insulation film 9a. On the insulation film 9b, a pad PD is formed. The wiring layer where the pad PD is formed is the upmost wiring layer. The pad PD is formed of a relatively thin conductor film 12a, a relatively thick conductor film 13a of aluminum for example as main element and a relatively thin conductor film 12b, which are laid sequentially from the lower layer. The conductor film 12a is made from a titanium film, titanium nitride film and titanium film for example which are laid sequentially from the lower layer. The conductor film 12b is a titanium nitride film for example. The power lines VLB1, VLB2, VLB3, etc. described above have the same vertical structure as the pad PD. The pad PD, however, has its insulation film removed partially at the portion where the wire WR is connected, and the wire WR is brought in direct contact to the conductor film 13a and bonded.

The sheet resistance of the pads PD and power lines VLB1, VLB2, VLB3, etc. is preferably as low as ⅓ or less of that of the fourth-layer buried lines M4 in consideration of the exclusive use of the upmost wiring layer for the wiring of pads PD and power lines. In this embodiment, the sheet resistance of these pads PD and power lines is selected to be around 18–20 mΩ/square for example. To attain this sheet resistance value, the upmost wiring layer for the pads PD and power lines VLB1, VLB2, VLB3, etc. has its thickness (sum of the thicknesses of the conductor films 12a, 12b and 13a) made thicker than the thickness d1 of the fourth-layer buried lines M4 immediately below it, i.e., two fold or preferably three fold or four fold of d1. Specifically, the pads PD and power lines VLB1, VLB2, VLB3, etc. (sum of the thicknesses of the conductor films 12a, 12b and 13a) have a thickness of around 2 μm for example. Having such a large thickness can reduce the sheet resistance of the upmost wiring layer and increase the bonding strength of wires WR, and consequently the yield of production and the reliability of the semiconductor device can be improved. A thru-hole TH5 is formed in the insulation films 11h and 9b, and the pad PD is connected electrically to the fourth-layer buried lines M4 via a plug 8c filled in the thru-hole TH5. The plug 8c has the same structure as other plugs such as the plug 8a. On the insulation film 9b, a surface protection film 3 is formed. The surface protection film 3 is made from an insulation film 3a of silicon oxide, an insulation film 3b of silicon nitride and a insulation film 3c of polyimide resin, etc. which are deposited sequentially from the lower layer.

Figure 40:
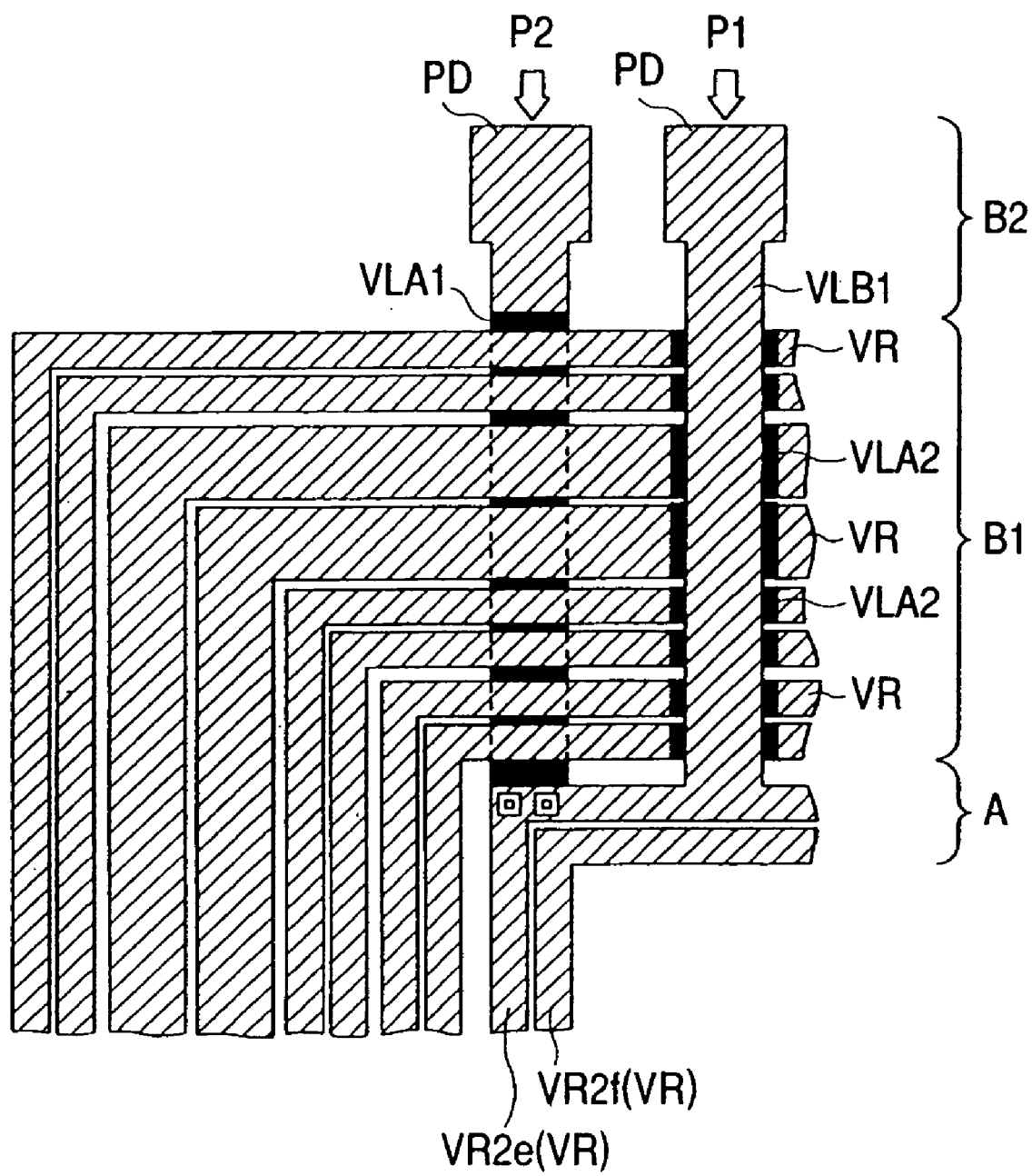
FIG. 40 is an explanatory diagram showing schematically the connection between the power pads and the ring power lines, the diagram comparing between an embodiment of this invention and the prior art which has been studied by the inventors of the present invention.
Figure 41:
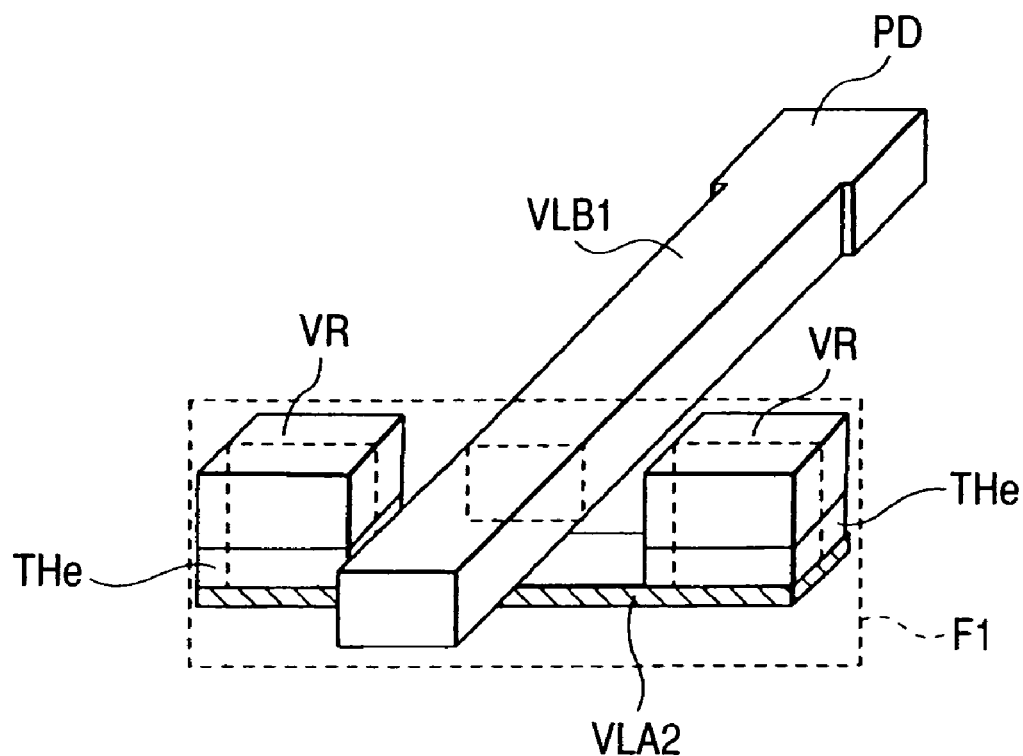
FIG. 41 is a perspective view of the principal portion of the path P1 shown in FIG. 40.
Figure 42:
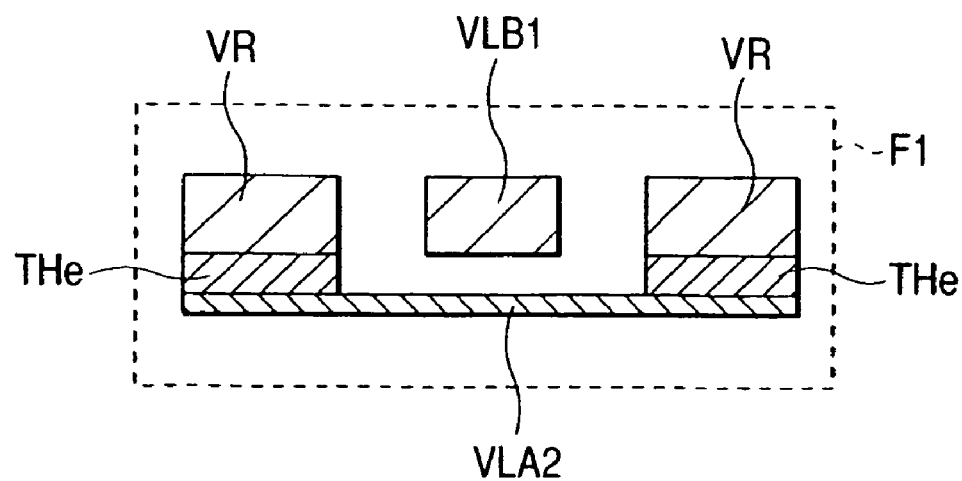
FIG. 42 is a cross-sectional view of the cut plane E1 of FIG. 41.
Figure 43:
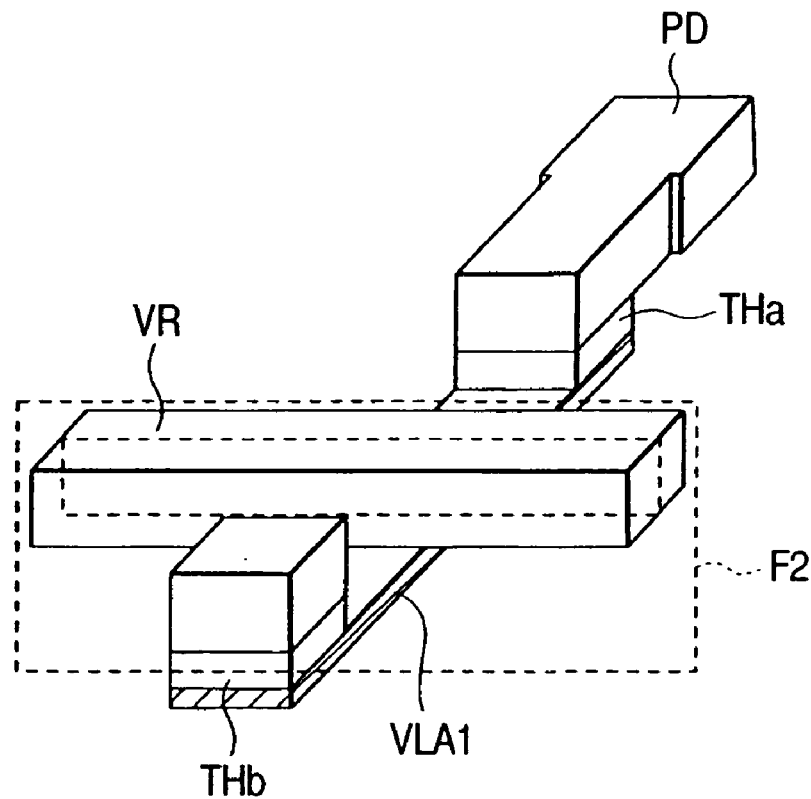
FIG. 43 is a perspective view of the principal portion of the path P2 shown in FIG. 40.
Figure 44:
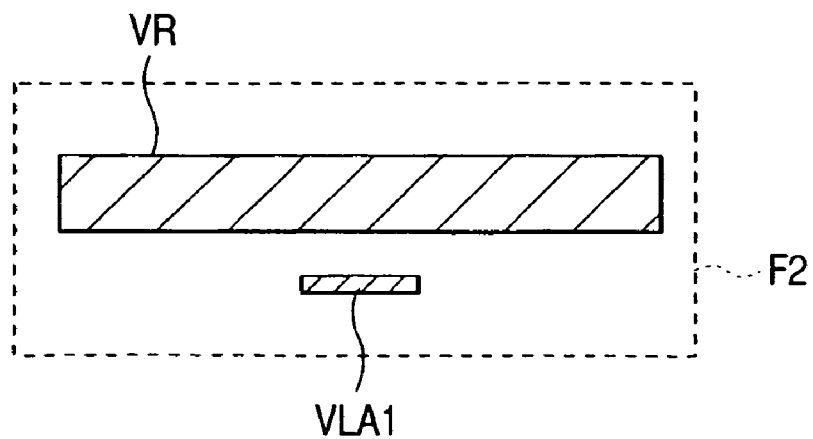
FIG. 44 is a cross-sectional view of the cut plane E2 of FIG. 43.

Next, the major effectiveness of this embodiment will be explained. The voltage drop on the power feed path down to the ring power lines VR2e and VR2f in the internal circuit area A achieved based on this embodiment will be explained. FIG. 40 is a diagram explaining schematically the connection between power pads PD and ring power lines VR, FIG. 41 is a perspective view of the principal portion of the path P1 shown in FIG. 40, FIG. 42 is a cross-sectional view of the cut plane F1 of FIG. 41, FIG. 43 is a perspective view of the principal portion of the path P2 shown in FIG. 40, and FIG. 44 is a cross-sectional view of the cut plane F2 of FIG. 43. The path P1 shown in FIG. 40 is of the case where the power supply pad PD is connected directly to the ring power line VR2e in the internal circuit area A based on this embodiment, whereas the path P2 is of the case where the power supply pad PD is connected by way of the lower-layer power line VLA1 to the ring power line VR2e. The difference of the paths P1 and P2 is merely the use of an aluminum wiring layer or a copper wiring layer for the connection between the pad PD and the ring power line VR2e.

The inventors of the present invention have calculated the voltage drop on the power feed path, separately in the pad area B2, input/output circuit area B1 and internal circuits area A. The calculation is based on the assumption that the semiconductor device has an operation frequency of 350 MHz for example, an internal circuit power voltage of 1.2 V for example, a power consumption of 1.8 W for example, i.e., a semiconductor chip load current of 1.5 A, and a pad input/output current of 0.058 A/pad for example.

For the pad area B2, the sheet resistance of the aluminum wiring layer is around 0.018 $\Omega$/square for example, the average line length is around 45 μm for example, and the line width is around 32 μm for example. The result of calculation of the voltage drop on the power feed lines in the pad area B2 for the assumed load conditions and line parameters is 1.46 mV for both the paths P1 and P2.

For the input/output circuit area B1, the average line length is around 261 μm for example, the line width is around 32 μm for example, and the sheet resistance of the copper wiring layer is around 0.06 $\Omega$/square for example. The result of calculation of the voltage drop on the power feed path in the input/output circuit area B1 for these line parameters is around 8.42 mV for the path P1 and around 28.22 mV for the path P2 (P1 and P2 differ only in sheet resistance).

For the internal circuit area A, the ring power lines VR has a side length of 6930 μm for example, the average line length shared by one pad PD is around 533.08 μm for example, and the line width is around 24.6 μm for example. The result of calculation of the voltage drop on the power feed path (ring power lines VR) in the internal circuit area A is 3.28 mV for both the paths P1 and P2.

These calculation results reveal that the input/output circuit area B1 contributes dominantly to the voltage drop on the power feed path. This embodiment can reduce the voltage drop by about 20 mV as compared with the connection scheme of path P2. This voltage drop reduction can be achieved for both the high power voltage VDD and reference power voltage VSS. Accordingly, this embodiment can reduce the voltage drop by a total of about 40 mV as compared with the connection scheme of path P2, and this reduction value is equivalent to about 60% of the voltage drop of the connection scheme of path P2.

The inventors of the present invention have also calculated the voltage drop at the operation frequency of 410 MHz of the semiconductor device based on the assumption that the power consumption is around 2.1 W for example and the load current is 0.067 A for example, with line parameters being identical to those of the preceding calculations. This embodiment can reduce the voltage drop by about 23 mV as compared with the connection scheme of path P2, which is equivalent to about 60% of the voltage drop of the connection scheme of path P2.

Accordingly, this embodiment highly effectuates the reduction of voltage drop in the input/output circuit area B1 which dominates the voltage drop on the power feed path of the semiconductor device. It can reduce the voltage drop on the power feed path to a certain extent regardless of the operation frequency of the semiconductor device. This embodiment, which can reduce the voltage drop more effectively on the power feed path to the internal circuits of semiconductor device which are vulnerable to a sagging power voltage at the high frequency operation, is proved to be an effectual technique for the power conduction design within semiconductor devices.

Embodiment 2

Peripheral circuits of semiconductor devices are occasionally designed to have separate power systems due to the inclusion of input/output circuits operating at different power voltages or for the sake of noise confinement. The second embodiment of this invention is intended for such power systems. In this embodiment, first ring power lines for conducting power to the peripheral circuits of semiconductor device are partially cut off, and the cut-off sections are used as second hemi-ring power lines. The first and second hemi-ring power lines have power supplies from different power sources of a same voltage or different voltages, and form independent power systems. Although the first and second hemi-ring power lines are not ring-shaped, this property does not impair the advantage of this invention, and therefore it is conceived to be a variant embodiment.

Figure 45:
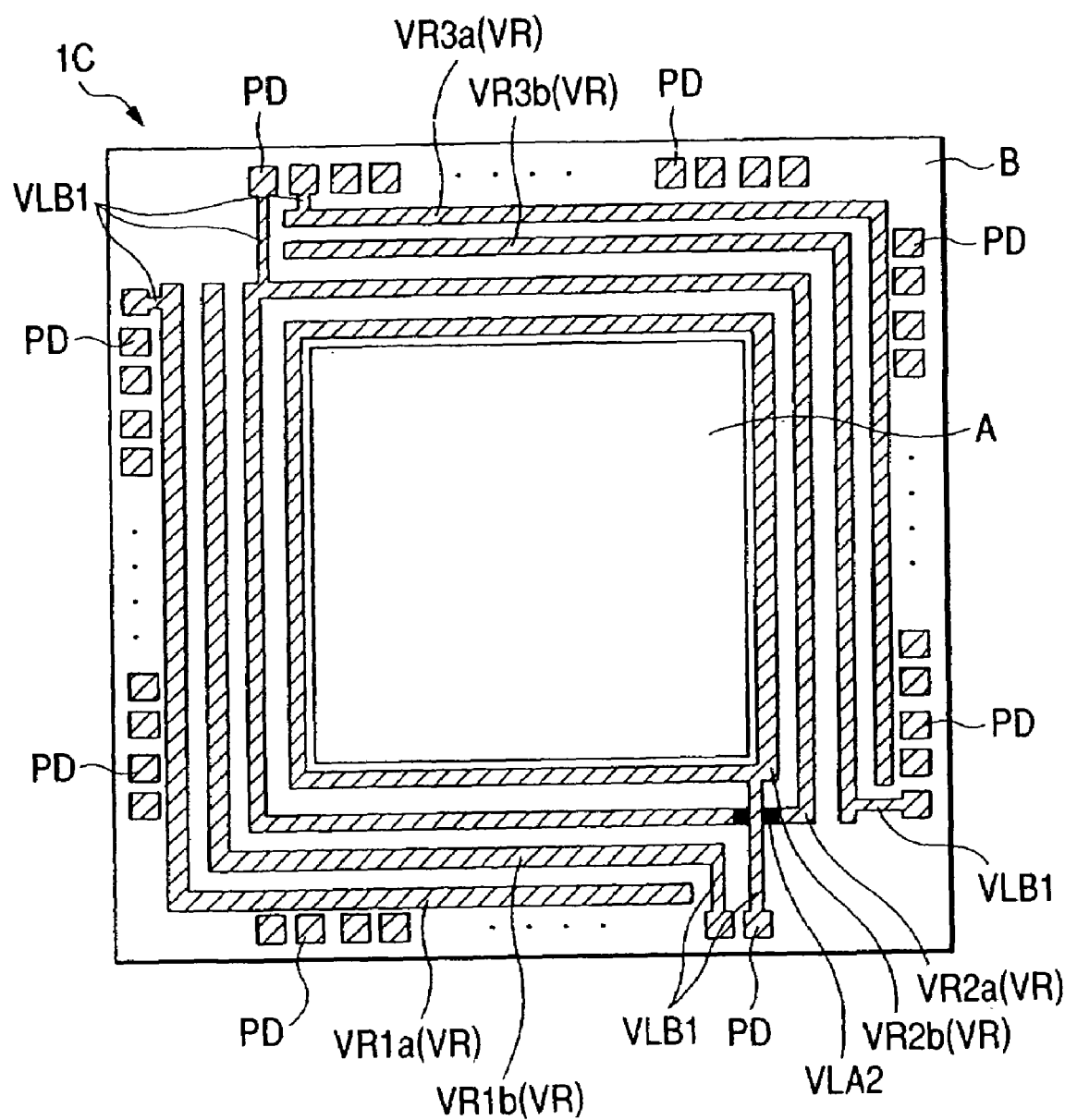
FIG. 45 is an overall plan view of a semiconductor chip (substrate) of a semiconductor device based on another embodiment of this invention.
Figure 46:
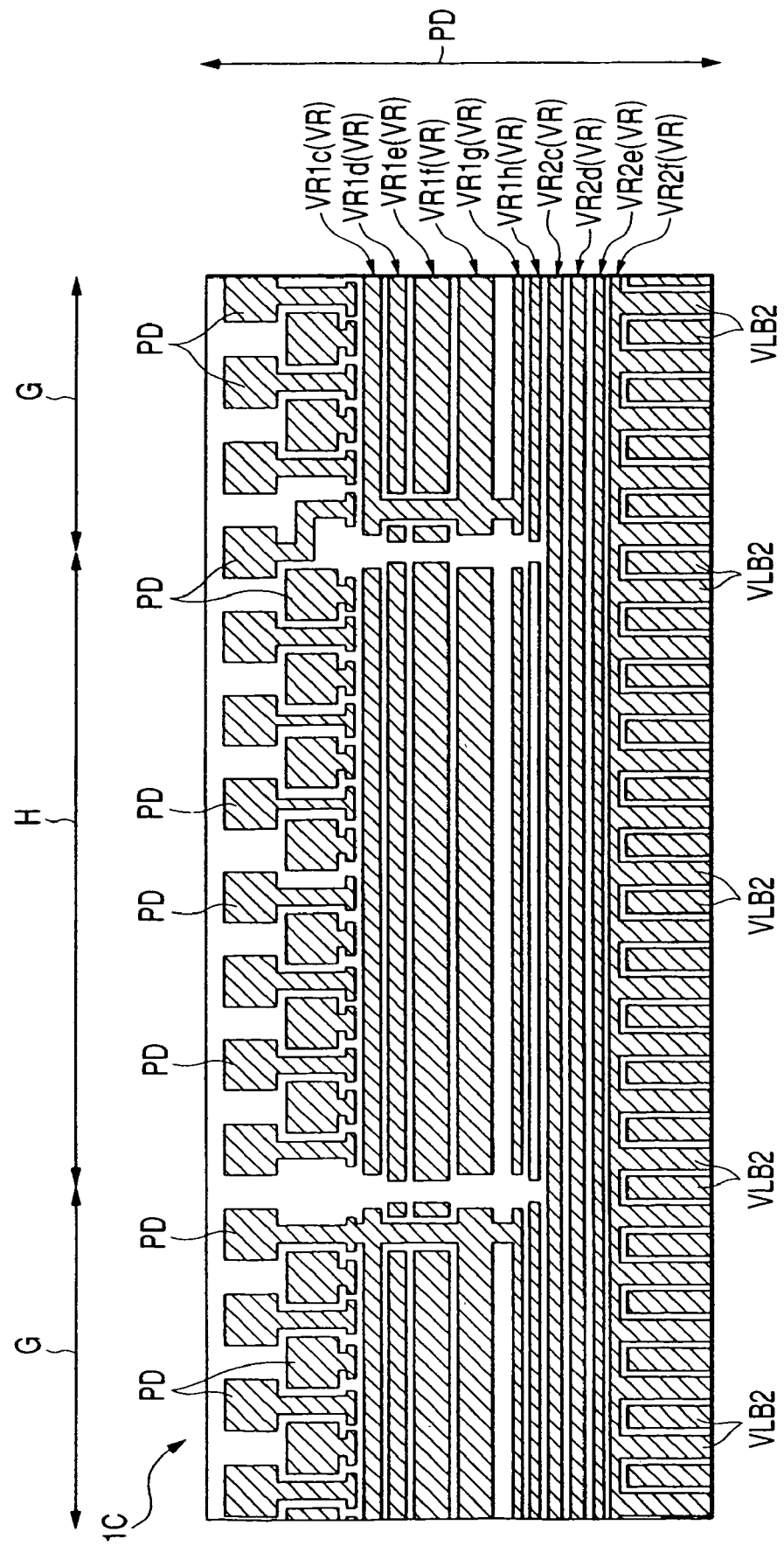
FIG. 46 is an enlarged plan view of the principal portion of the semiconductor device shown in FIG. 45.

FIG. 45 shows briefly an example of ring power lines VR in the peripheral circuit area of semiconductor device based on the second embodiment. Shown in the figure are the ring power lines VR of peripheral circuit area B, which are separated into first hemi-ring power lines VR1a and VR1b and second hemi-ring power lines VR3a and VR3b. The first hemi-ring power lines VR1a and VR1b are used to feed a power voltage of around 3.3 V for example (VR1a for the high voltage and VR1b for the reference voltage) to the peripheral circuits. The second hemi-ring power lines VR3a and VR3b are used to feed another power voltage of around 2.5 V for example (VR3a for the high voltage, e.g., 2.5 V, and VR3b for the reference voltage, e.g., 0 V) to the peripheral circuits. The peripheral circuits have their power supply pads PD connected electrically to the first and second hemi-ring power lines VR1a, VR1b, VR3a and VR3b through power lines VLB1. The internal circuits have their power line pads PD connected electrically to the ring power lines VR2a and VR2b, which are close to the internal circuits, through power lines VLB1. FIG. 46 is a plan view of the semiconductor device of the second embodiment, showing in more detail the peripheral circuit area B. Indicated by G is an area where the hemi-ring power lines VR of the 3.3 V power system are laid, and indicated by H is an area where the hemi-ring power lines VR of the 2.5 V power system are laid. The hemi-ring power lines VR in the areas G and H are separated electrically from each other, and used independently for power conduction.

According to the second embodiment, even for semiconductor devices which are designed to have separate power systems due to the inclusion of input/output circuits operating at different power voltages or for the sake of noise confinement, the voltage drop on the power feed path from the power supply pads to the peripheral circuits (e.g., peripheral circuits of 3.3 V power system and peripheral circuits of 2.5 V power system) and to the internal circuits can be reduced, and thus the stability of power supply can be enhanced, and thus the performance of semiconductor device can be upgraded.

Embodiment 3

Figure 47:
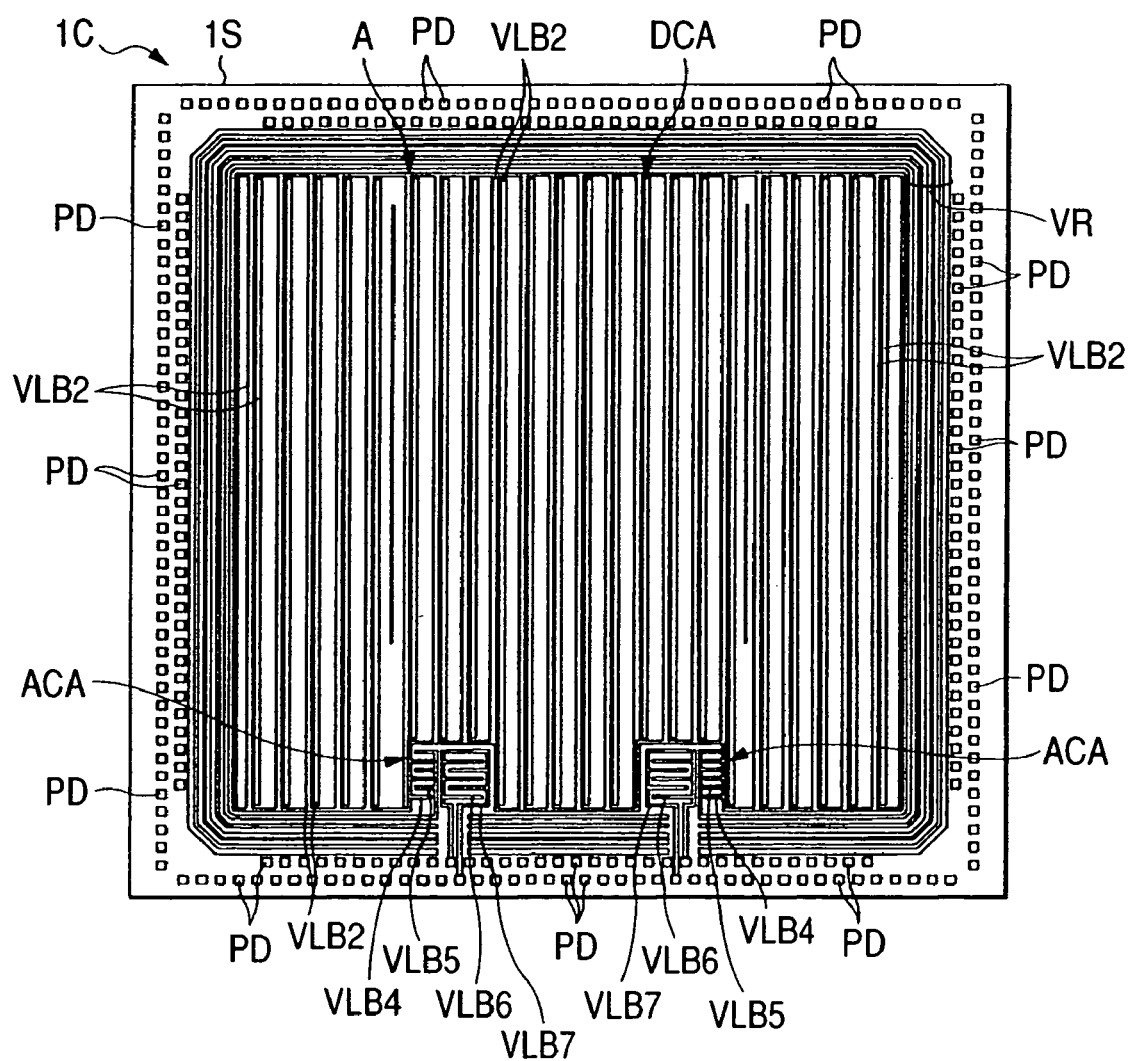
FIG. 47 is an overall plan view of a semiconductor chip (substrate) of a semiconductor device based on still another embodiment of this invention.
Figure 48:
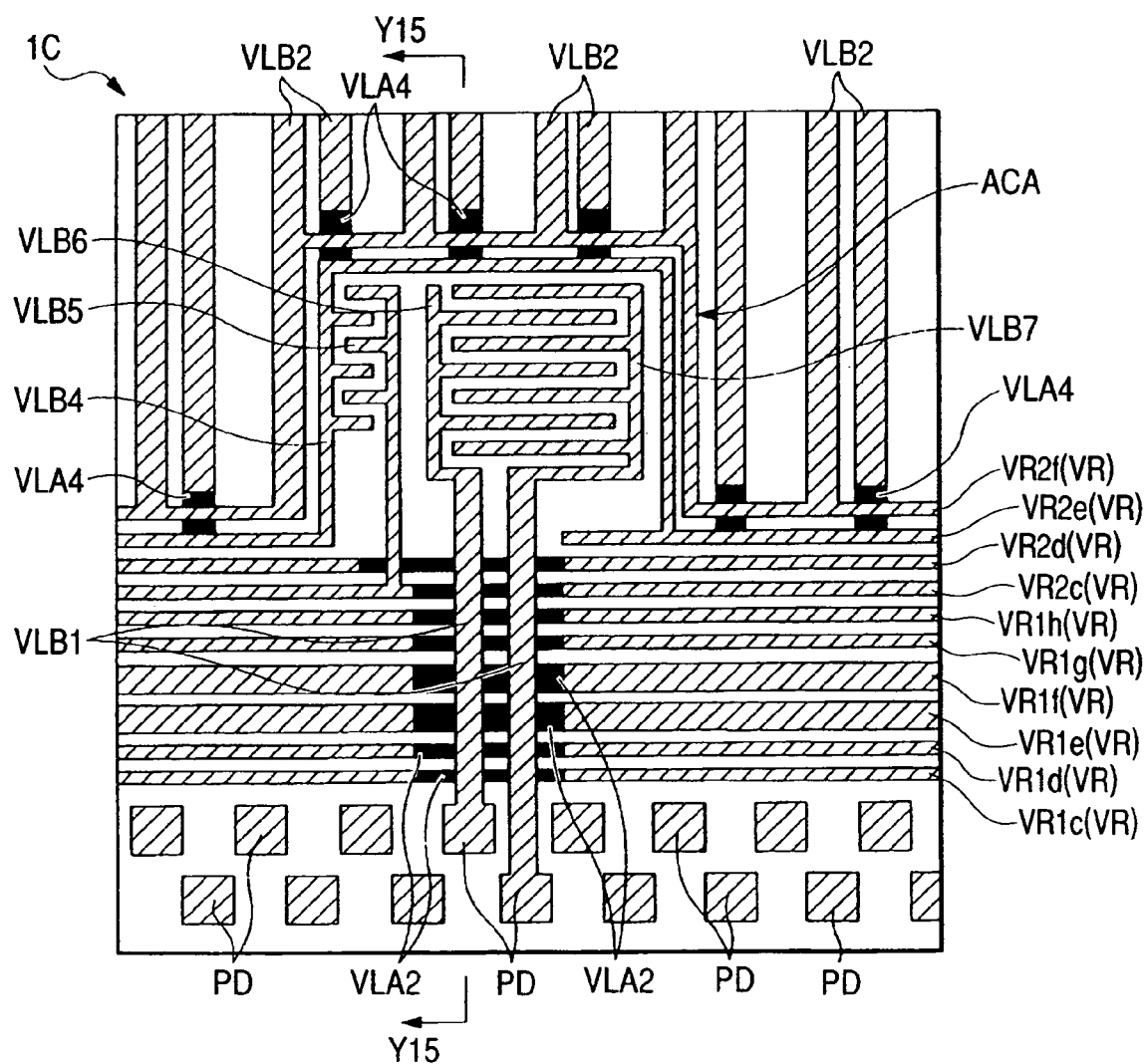
FIG. 48 is an enlarged plan view of the principal portion of the semiconductor device shown in FIG. 47.
Figure 49:
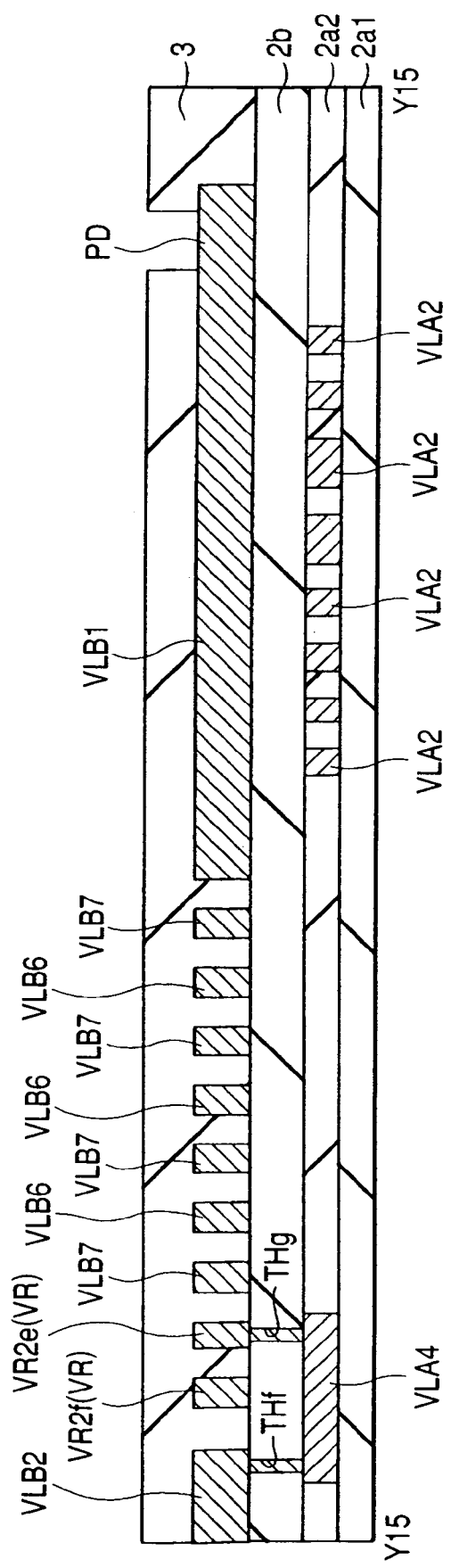
FIG. 49 is a cross-sectional view of the upmost wiring layer and the wiring layer immediately below it taken along the line Y15—Y15 of FIG. 48.

FIG. 47, FIG. 48 and FIG. 49 show a semiconductor device based on the third embodiment of this invention. FIG. 47 shows by plan view the semiconductor chip (substrate) of the semiconductor device of this embodiment, FIG. 48 shows by plan view the principal portion of the analog circuit of the semiconductor chip (substrate) shown in FIG. 47, with lines of the wiring layer immediately below the upmost wiring layer being shown by black-painting for the sake of clarity, and FIG. 49 shows the cross section of the semiconductor chip (substrate) taken along the line Y15—Y15 of FIG. 48.

The semiconductor device of this embodiment is a hybrid semiconductor device having a digital circuit area DCA and analog circuit areas ACA in the internal circuit area A of a semiconductor chip (substrate) 1C. The connection between pads PD and ring power lines VR is similar to the cases of the first and second embodiments, and explanation is omitted. The analog circuit areas ACA have a layout of power feed lines of two power systems of different voltages. One power system has power lines VLB4 and VLB5, and another power system has power lines VLB6 and VLB7. These power lines VLB4, VLB5, VLB6 and VLB7 are comprised of aluminum as main element common to the pads PD formed on the upmost wiring layer. The power lines VLB4 of one power system are formed as a unitary stuff common to the innermost ring power line VR2e, and are used for the high power voltage. The power lines VLB5 are formed as a unitary stuff common to the innermost ring power line VR2c, and are used for the reference power voltage. These power lines VLB4 and VLB5 have a comb shape, and are laid out to engage with each other.

The power lines VLB6 of another power system are used for the reference power voltage for example, and the power lines VLB7 are used for the high power voltage for example. These power lines VLB6 and VLB7 have a comb shape, and are laid out to engage with each other in the analog circuit areas ACA. This embodiment is intended to reinforce the power conduction to the analog circuits, which are vulnerable to noises as compared with the digital circuits, by separating the power supply to some analog circuits from the power supply of digital circuits, and conducting the power voltages directly from the pads PD in the same manner as the first and second embodiments. Namely, the power supply pads PD are connected directly and electrically to the power lines VLB6 and VLB7 through the power lines VLB1. Consequently, the voltage drop on the power feed path from the pads PD to the analog circuits can be reduced, and thus the analog circuits can be supplied with stable power voltages, and thus the analog circuits can be much durable against noises, and thus the circuits can be much durable against noises, and thus the semiconductor device can be enhanced in operational reliability. Although the present invention has been described in connection with the specific embodiments, the invention is not confined to these embodiments, but various alterations are obviously possible without departing from the essence of the invention.

For example, in case the upmost wiring layer is not a wiring layer with the lowest sheet resistance, the ring power lines and pads may be laid out and connected on a wiring layer with the lowest sheet resistance. In case the power supply pads are laid out on the upmost wiring layer and the ring power lines are formed of a wiring layer with the lowest sheet resistance, the power supply pads may be connected electrically to the ring power lines via thru-holes. The pads and ring power lines may both be laid out on a wiring layer with the lowest sheet resistance, and connected directly in the same manner as the preceding embodiments. In regard to the power cells and input/output circuit cells, the pattern layer to be used for the ring power lines may be replaced with a wiring layer with the lowest sheet resistance, and the pattern layer for the bypass lines may be replaced with a proper wiring layer.

Although in the foregoing embodiments, the upmost wiring layer and the wiring layer immediately below it are different in material, the inventive scheme explained in the foregoing embodiments can be applied to cases where there is a difference in sheet resistance between the upmost wiring layer and the wiring layer immediately below it. For example, even in case the upmost wiring layer and the wiring layer immediately below it are comprised of same aluminum or copper as main element, but are different in sheet resistance, the inventive scheme of the foregoing embodiments can be applied to effectuate the stable power supply.

Although the embodiments of invention which are semiconductor devices including logic circuits have been explained mainly, the present invention is also applicable to semiconductor devices having memory circuits such as SRAM (Static Random Access Memory) or flash memories of EEPROM (Electrically Erasable Programmable Read Only Memory) and to hybrid semiconductor devices including memory circuits and logic circuits on a same substrate.

Among the affairs of the present invention disclosed in this specification, the major effectiveness is briefed as follows.

Based on the direct connection, on a same wiring layer, of multiple external terminals and multiple power lines which are laid to run around the outer edge of the first internal circuit area, it becomes possible to enhance the stability of power supply within the semiconductor device.

What is claimed is:

1. A semiconductor device having a first circuit area inside a semiconductor chip and a plurality of wiring layers which are formed above a main surface of a semiconductor substrate, said wiring layers including a first wiring layer which is comprised of copper as a main element, with a plurality of first lines being formed thereof, and a second wiring layer which is an upmost wiring layer among said wiring layers and is comprised of aluminum as a main element, with a plurality of second lines being formed thereof, a first line of said first wiring layer being formed by a buried line, said second lines of said second wiring layer being made larger in thickness than said first lines of said first wiring layer which is immediately below said second wiring layer, said second lines of said second wiring layer having a plurality of external terminals, a plurality of first power lines surrounding said first circuit area, and a plurality of second power lines each of which is directly connected to an external terminal and a first power line.

2. A semiconductor device according to claim 1, wherein said second lines are lower in sheet resistance than said first lines.

* * * * *